(12) United States Patent
Hatano et al.

(10) Patent No.: US 7,414,333 B2
(45) Date of Patent: Aug. 19, 2008

(54) HIGH-VOLTAGE PULSE GENERATING CIRCUIT

(75) Inventors: Tatsuhiko Hatano, Kasugai (JP); Takeshi Sakuma, Nagoya (JP); Katsuji Iida, Atsugi (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 11/447,377

(22) Filed: Jun. 6, 2006

(65) Prior Publication Data

US 2006/0226883 A1    Oct. 12, 2006

Related U.S. Application Data

(63) Continuation of application No. 10/457,164, filed on Jun. 9, 2003, now Pat. No. 7,084,528.

(30) Foreign Application Priority Data

Jun. 12, 2002 (JP) ............................. 2002-171684
Mar. 3, 2003 (JP) ............................. 2003-056308

(51) Int. Cl.
*H03K 3/00* (2006.01)
(52) U.S. Cl. ...................................... 307/106
(58) Field of Classification Search ................. 307/106
See application file for complete search history.

(56) References Cited

U.S. PATENT DOCUMENTS

| | | |
|---|---|---|
| 3,176,158 A | 3/1965 | Guignard |
| 3,367,314 A | 2/1968 | Hirosawa et al. |
| 3,485,227 A | 12/1969 | Meyerle |
| 3,510,676 A | 5/1970 | Pierce, Jr. |
| 3,671,761 A | 6/1972 | Shibuya et al. |
| 3,877,864 A * | 4/1975 | Carlson ....................... 431/264 |
| 4,028,559 A * | 6/1977 | Larner .......................... 327/168 |
| 4,740,722 A | 4/1988 | Furuhata |

(Continued)

FOREIGN PATENT DOCUMENTS

EP    0 959 562 A1    11/1999

(Continued)

OTHER PUBLICATIONS

U.S. Appl. No. 11/293,324, filed Dec. 5, 2005, Sekiya et al.

(Continued)

*Primary Examiner*—Michael J Sherry
*Assistant Examiner*—Dru M Parries
(74) *Attorney, Agent, or Firm*—Burr & Brown

(57) ABSTRACT

A high-voltage pulse generating circuit has an inductor, a first semiconductor switch, and a second semiconductor switch which are connected in series between opposite terminals of a DC power supply unit, and a diode having a cathode terminal connected to a terminal of the inductor which has another terminal connected to an anode terminal of the first semiconductor switch, and an anode terminal connected to a gate terminal of the first semiconductor switch. The inductor stores an induction energy when the first semiconductor switch is rendered conductive by a turn-on of the second semiconductor switch, and generates a high-voltage pulse when the first semiconductor switch is turned off by a turn-off of the second semiconductor switch.

5 Claims, 16 Drawing Sheets

U.S. PATENT DOCUMENTS

| | | | |
|---|---|---|---|
| 5,151,762 | A | 9/1992 | Uenishi et al. |
| 5,514,918 | A | 5/1996 | Inatomi et al. |
| 5,530,617 | A * | 6/1996 | Bonavia et al. ............. 361/253 |
| 5,627,741 | A | 5/1997 | Naruo et al. |
| 5,774,348 | A | 6/1998 | Druce et al. |
| 6,608,768 | B2 | 8/2003 | Sula |
| 6,879,062 | B2 * | 4/2005 | Oates ......................... 307/140 |
| 2003/0209993 | A1 | 11/2003 | Ito et al. |
| 2003/0230938 | A1 | 12/2003 | Hatano et al. |

FOREIGN PATENT DOCUMENTS

| | | |
|---|---|---|
| EP | 1 376 868 A2 | 1/2004 |
| GB | 2 105 927 A1 | 3/1983 |
| JP | 62-289249 A1 | 12/1987 |
| JP | 08-223915 A1 | 8/1996 |
| JP | 10-076182 A1 | 3/1998 |
| JP | 11-145793 A1 | 5/1999 |
| JP | 2002-044965 A1 | 2/2002 |
| JP | 2003-272887 A1 | 9/2003 |
| JP | 2003-338648 A1 | 11/2003 |
| JP | 2004-072994 A1 | 3/2004 |

OTHER PUBLICATIONS

U.S. Appl. No. 11/405,698, filed Apr. 18, 2006.
U.S. Appl. No. 10/579,557, filed Nov. 17, 2004.
Iida, Katuji et al., "Ultra Short-width High-Voltage Pulse Generator," NGK Insulators, Ltd., Lecture No. PST-02-16.
Jiang, Weihua et al., "Compact, High Repetition-rate Pulsed Power Generator Using High-speed Si-thyristor," Conference Record of the 25$^{TH}$ International Power Modulator Symposium and 2002 High-voltage Workshop. Hollywood, CA, Jun. 30-Jul. 3, 2002, International Power Modulator Symposiums, New York, NY: IEEE, US, Jun. 30, 2002, pp. 602-604, XP010636721 ISBN: 0-7803-7540-8.
Yamashita, Keiichi et al., "High Rep-rate Inductive-Energy-Storage Pulsed Power Modulator Using High Voltage Static Induction Thyristor,"Conference Record of the 25$^{TH}$ International Power Modulator Symposium and 2002 High-Voltage Workshop. Hollywood, CA, Jun. 30-Jul. 3, 2002, International Power Modulator Symposium, New York, NY: IEEE, US, Jun. 30, 2002, pp. 382-385, XP010636665 ISBN: 0-7803-7540-8.
Bowles, E.E. et al., "30 kA, 5000 V Solid State Opening Switch for Inductive Energy Stores," Proceedings of the Power Modulator Symposium, Myrtle Beach, South Carolina, Jun. 23-25, 1992, New York, IEEE, US, vol. Symp. 20, Jun. 23, 1992, pp. 249-253, XP000348411 ISBN: 0-7803-0718-6.
Ichikawa, Yukimi et al., "Deposition of a-Si : H Based Film by High Voltage Pulse Discharge CVD," The Japan Society of Applied Physics, 1992, Oyo Buturi, vol. 61, No. 10, pp. 1039-1043 with Partial English Translation.
Namihira, Takao et al., "Improvement of NOx Removal Efficiency Using Short-Width Pulsed Power," IEEE Transactions on Plasmic Science, vol. 28, No. 2, Apr., 2000, pp. 434-442.

\* cited by examiner

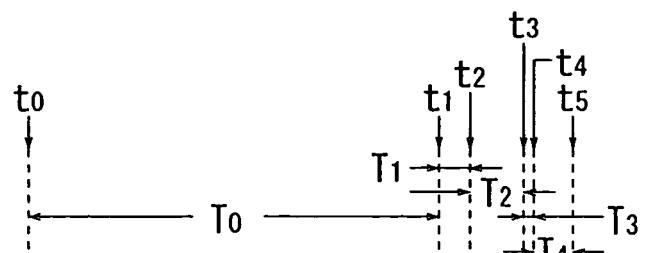
FIG. 2A
$I_L$
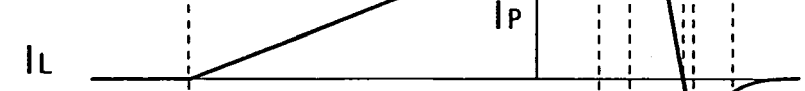
FIG. 2B
$V_{AG}$
FIG. 2C
$V_L$
FIG. 2D
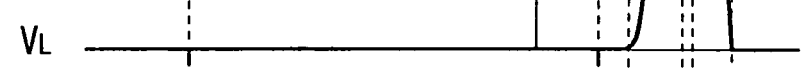
SWITCH 34
FIG. 2E
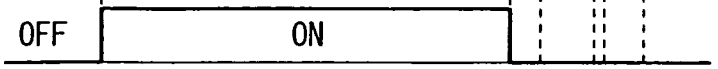
CONTROL SIGNAL $V_C$

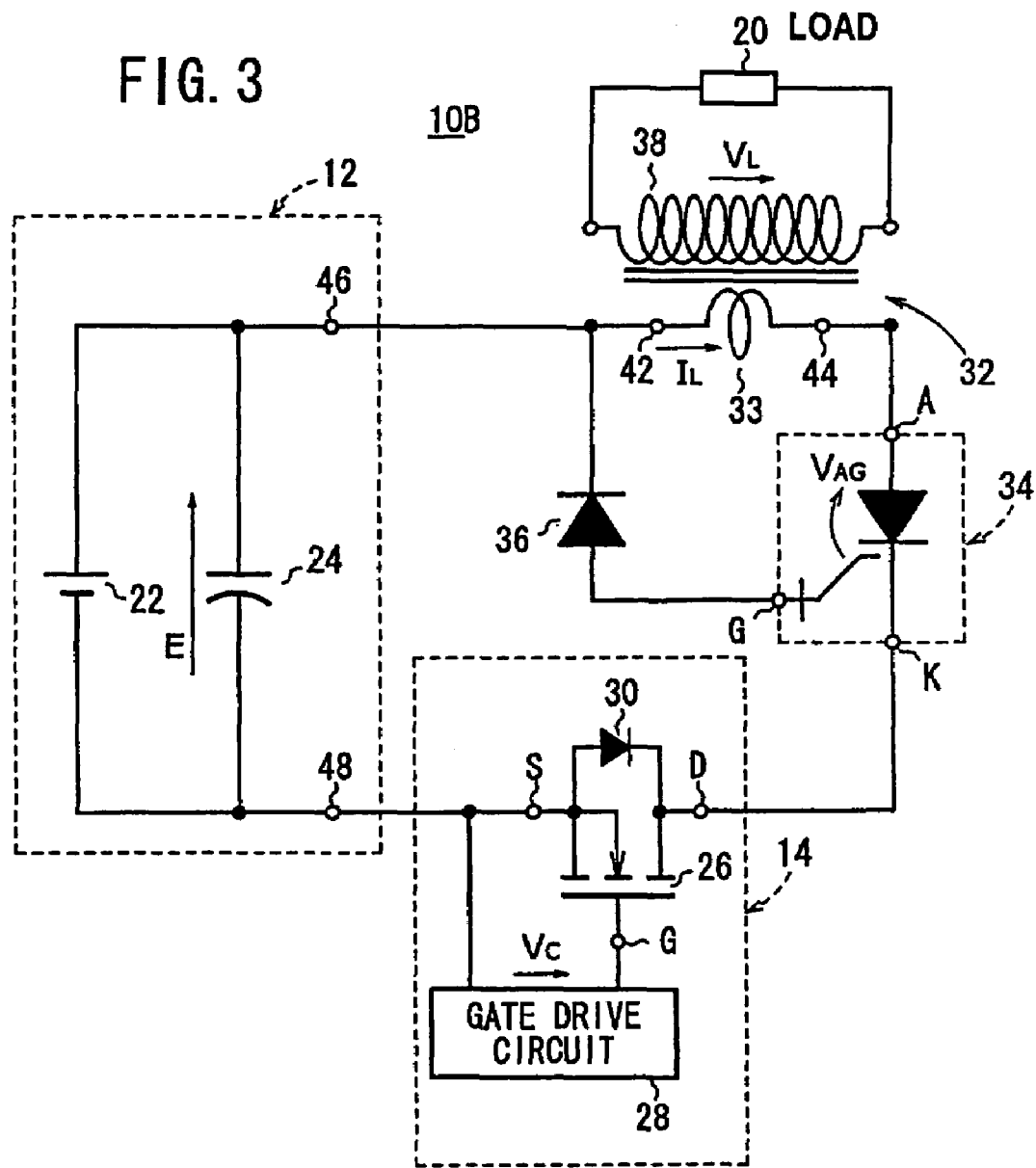

US 7,414,333 B2

HIGH-VOLTAGE PULSE GENERATING CIRCUIT

CROSS REFERENCE TO RELATED APPLICATION

This application is a continuation of U.S. application Ser. No. 10/457,164, filed Jun. 9, 2003, now U.S. Pat. No. 7,084,528, the entirety of which is incorporated herein by reference.

BACKGROUND OF THE INVENTION

1. Field of the Invention

The present invention relates to a high-voltage pulse generating circuit of a simple arrangement for supplying a high-voltage pulse having an extremely short rise time and an extremely short pulse duration by releasing electromagnetic energy which has been stored in an inductor from a low-voltage DC power supply unit.

2. Description of the Related Art

There has recently been proposed a technology for generating a plasma by discharging a high-voltage pulse to perform deodorization, sterilization and also to decompose toxic gases. Generating such a plasma requires a high-voltage pulse generating circuit which is capable of generating a pulse having a high voltage and an extremely short pulse duration.

As shown in FIG. 15 of the accompanying drawings, a conventional high-voltage pulse generating circuit 100 comprises a capacitor charger 102, a capacitor 104, a switch 108, and a load 110 (see Japanese Laid-Open Patent Publication No. 2002-44965, for example).

The capacitor charger 102 generates a high DC voltage which is substantially equal to the peak value of a high-voltage pulse. The capacitor 104 is charged by the capacitor charger 102 to a voltage which is substantially equal to the high DC voltage generated by the capacitor charger 102. In order for the switch 108 to have a large withstand voltage, the switch 108 comprises a plurality of semiconductor devices 106 such as SI (Static Induction) thyristors or the like which are connected in series. The load 110 is supplied with a high-voltage pulse by high-speed switching operation of the switch 108 under the high DC voltage charged in the capacitor 104.

The switch 108 has a plurality of gate drive circuits 112 connected to the respective semiconductor devices 106 to turn on the semiconductor devices 106, and a plurality of balancing resistors 114 connected parallel to the respective semiconductor devices 106. The balancing resistors 114 serve to reduce any unbalances between the voltages applied across the respective semiconductor devices 106 due to impedance variations caused when the semiconductor devices 106 are rendered nonconductive.

Specifically, the high-voltage pulse generating circuit 100 has a multiple-series-connected circuit 116 of semiconductor devices 106 and balancing resistors 114 which are connected in series to the load 110.

FIG. 16 of the accompanying drawings shows a proposed high-voltage pulse generating circuit 118. In the proposed high-voltage pulse generating circuit 118, when a semiconductor switch 126 is turned on, a current flows from a DC power supply 120 (having a power supply voltage E) to a resistor 136 (having a resistance R) to the one-turn primary windings of respective maginetizable cores 128 to the semiconductor switch 126 to the DC power supply 120, the current having a magnitude represented substantially by E/R.

At this time, because of the maginetizable cores 128 operating as a transformer, the same current flows through the one-turn secondary windings of respective maginetizable cores 128 via the gates and cathodes of semiconductor devices 134. Therefore, all the semiconductor devices 134 are simultaneously turned on (see, for example, The Institute of Electrical Engineers of Japan, Plasma Science and Technology, Lecture No. PST-02-16).

The semiconductor devices 134 connected in series, and the semiconductor switch 126 are rendered conductive, a voltage which is substantially the same as the power supply voltage E is applied to an inductor 138. As a result, a current $I_L$ flowing through the inductor 138 increases linearly, storing electromagnetic energy in the inductor 138.

The current $I_L$ flowing through the inductor 138 increases until electromagnetic energy is stored up to a desired level in the inductor 138. When the semiconductor switch 126 is turned off, since the path of the current $I_L$ flowing through the inductor 138 is cut off, an induced voltage of opposite polarity is generated due to the stored electromagnetic energy in the inductor 138.

As a consequence, the diode 140 is rendered conductive, allowing a current to flow continuously from the inductor 138 to the semiconductor devices 134, the primary windings of the respective maginetizable cores 128 to the diode 140 to the inductor 138. At this time, a current of the same magnitude also flows through the secondary windings of the maginetizable cores 128.

Thus, the current flowing into the anodes of the semiconductor devices 134 flows entirely into the gates thereof, with no current flowing to the cathodes thereof. The current flows until the electric charges stored in the semiconductor devices 134 are discharged. Since no large voltage drop is caused in the current path and this state merely continues for an extremely short period of time, any reduction in the current $I_L$ flowing through the inductor 138 is small, and any reduction in the stored electromagnetic energy in the inductor 138 is also small.

As the electric charges stored in the semiconductor devices 134 are discharged, the semiconductor devices 134 are turned off, with a depletion layer being quickly developed therein. Since the inductor current is charged with a small electric capacity, the voltage between the anode and cathode of each of the semiconductor devices 134 rises sharply. Therefore, the voltage across the inductor 138 increases quickly, and the current $I_L$ flowing through the inductor 138 decreases quickly. Stated otherwise, the electromagnetic energy in the inductor 138 is shifted into a capacitive electrostatic energy stored between the anode and cathode of each of the semiconductor devices 134. Since the voltage across the inductor 138 is also applied to a load 142 connected across the inductor 138, the electromagnetic energy in the inductor 138 and the capacitive electrostatic energy stored between the anode and cathode of each of the semiconductor devices 134 are consumed by the load 142 while the electromagnetic energy is being shifted into the electrostatic energy.

With the high-voltage pulse generating circuit 118, the DC power supply 120 may generate a low voltage and the semiconductor devices 134 may be turned on and off only by currents flowing through the secondary windings of the maginetizable cores 128. Consequently, the high-voltage pulse generating circuit 118 requires no gate drive circuits and is relatively simple.

However, the conventional high-voltage pulse generating circuit 100 shown in FIG. 15 has a complex circuit arrangement. A high voltage is applied to all the circuit components including the capacitor charger 102. The circuit components need to be insulated against each other, e.g., need to be spaced from each other by a large distance. Therefore, the conventional high-voltage pulse generating circuit 100 tends to be large in size and high in cost.

If only some of the series-connected semiconductor devices 106 are turned on due to malfunctions, then the remaining semiconductor devices 106 may be damaged by an overvoltage in excess of a rated voltage applied thereto. Accordingly, the operation of the conventional high-voltage pulse generating circuit 100 is not reliable.

Furthermore, for the conventional high-voltage pulse generating circuit 100 to generate a pulse which rises extremely sharply, e.g., at 10 kV/μsec or above, it is necessary that each of the semiconductor devices 106 be turned on quickly. Consequently, even if gate signals are applied to the semiconductor devices 106 at timings differing merely by 2 nsec or 3 nsec, or semiconductor devices 106 are turned on at timings differing merely by 2 nsec or 3 nsec, generated transient voltages are liable to be out of balance. The conventional high-voltage pulse generating circuit 100 thus suffers greater difficulty generating a pulse at several hundreds V/μsec than a series-connected array of semiconductor devices in an ordinary inverter.

With the proposed high-voltage pulse generating circuit 118 shown in FIG. 16, however, the DC power supply 120 may generate a low voltage, and a voltage in excess of the withstand voltage is never be applied to the semiconductor devices 134 even if some are turned off due to malfunctions. However, the timings of the turning off of the semiconductor devices 134 differ, making it highly difficult to prevent transient voltages from being brought out of balance when the semiconductor devices 134 are turned off quickly. Therefore, the proposed high-voltage pulse generating circuit 118 also suffers the same problems of series-connected semiconductor devices.

In the high-voltage pulse generating circuit 118, the maginetizable cores 128 are connected in series to the diode 140. As a consequence, inductances exist due to the physical distance in which the maginetizable cores are provided and also due to leakages between the finite primary and secondary windings. Because of these inductances, it takes time for the inductor current, which flows when the semiconductor switch 126 is turned off, to be commutated to the diode 140. As a result, the rate at which the gate current increases is suppressed, causing the semiconductor device 134 to remain conductive longer and the depletion region to spread (with the turn-off gain becoming one or more), which makes the high-voltage pulse generating circuit 118 unstable when the semiconductor devices 134 are turned off sharply.

SUMMARY OF THE INVENTION

It is therefore an object of the present invention to provide a high-voltage pulse generating circuit which is of a simple arrangement free of a plurality of semiconductor switches to which a high voltage is applied, and is capable of supplying a high-voltage pulse having an extremely short rise time and an extremely short pulse duration.

A high-voltage pulse generating circuit according to the present invention has an inductor, a first semiconductor switch, which preferably has as high a voltage rating as possible, and a second semiconductor switch, which may have a voltage rating as low as a DC power supply voltage, connected in series between opposite terminals of a DC power supply unit. A diode has a cathode terminal connected to a terminal of the inductor whose other terminal is connected to an anode terminal of the first semiconductor switch, and an anode terminal connected to a control (gate) terminal of the first semiconductor switch. The high-voltage pulse generating circuit thus has a highly simple arrangement.

When the second semiconductor switch is turned on, the first semiconductor switch is rendered conductive, applying the voltage of the DC power supply unit to the inductor, which stores an induction energy therein. When the second semiconductor switch is subsequently turned off, the first semiconductor switch is also turned off quickly. Therefore, the inductor generates a high-voltage pulse having an extremely short rise time and an extremely short pulse duration.

A load which is supplied with the high-voltage pulse from the inductor may be connected parallel to the inductor or parallel to the first semiconductor switch.

According to the present invention, the inductor may comprise a primary winding and a secondary winding magnetically coupled to each other. Since a voltage which is substantially the same as the voltage generated by the inductor is applied to the first semiconductor switch, the voltage generated by the inductor cannot be set to a level equal to or higher than the withstand voltage of the first semiconductor switch.

If the high-voltage pulse generating circuit is required to produce an output voltage higher than the withstand voltage of the first semiconductor switch, then the secondary winding may have a greater number of turns than the primary winding to generate a high-voltage pulse across the secondary winding of the inductor, which has a voltage higher than the withstand voltage of the first semiconductor switch.

The inductor may comprise a primary winding and a secondary winding connected to a primary winding without insulating a DC signal. The secondary winding may be connected to a primary winding without insulating a DC signal, but connected to the primary winding in additive polarity, for outputting a high-voltage pulse having a voltage which is the sum of voltages generated across the primary and secondary windings.

If the inductor is constructed of the primary and secondary windings, the inductor should preferably have a maginetizable core to provide a close magnetic coupling between the primary and secondary windings and suppress a magnetic flux leakage therefrom.

Devices which can be used as the first semiconductor switch will be described below. The first semiconductor switch may comprise a device controlled based on current or a self-extinguishing or commutation-turn-off device. Specifically, the first semiconductor switch may comprise an SI thyristor, a GTO (Gate-Turn-Off) thyristor, an SIT (Static Induction Transistor), a bipolar transistor, a thyristor, or the like. Of these devices, a current-controlled, self-extinguishing thyristor such as a GTO is preferable. Particularly, if a device having high turn-on and turn-off speeds is required for generating a short-duration pulse, then an SI thyristor is preferable for use as the first semiconductor switch. A field effect alone can turn on an SI thyristor by applying a slight positive voltage between the gate and cathode thereof if the current rise rate at the time it is turned on is relatively small.

When the first semiconductor switch is to be turned off, a current is drawn from the gate thereof to eliminate electric charges stored in the first semiconductor switch, developing a depletion layer therein to completely turn off the first semiconductor switch. If the high-voltage pulse generating circuit is used in an ordinary inverter or the like, then a turn-off of the first semiconductor switch can be achieved when the drawing of the current from the gate is completed even if the turn-off gain is equal to or greater than 1, i.e., even if the gate current is smaller than the anode current and does not have a high increase rate.

If a sharp turn-off needs to be achieved such as in a pulse power application, then it is necessary to make the turn-off gate current equal to the anode current (the turn-off gain is 1) or greater than the anode current (the turn-off gain is less than 1) and quickly increase the turn-off gate current, and to achieve an ideal stable turn-off to eliminate the cathode current before the drawing of the electric charges stored in the first semiconductor switch is completed.

However, since the anode current is usually high, it is very difficult and not practical for an ordinarily gate drive circuit to supply such current from the gate in order to make the turn-off gain equal to or less than 1 and to turn off the first semiconductor switch sharply (in a time of ten and several nsec. until the gate current is equalized to the anode current).

Functionally, the high-voltage pulse generating circuit according to the present invention makes the turn-off gain equal to or less than 1 apparently without the need for such a gate drive circuit.

The second semiconductor switch may comprise a self-extinguishing or commutation-turn-off device. For example, the second semiconductor switch may comprise a power metal-oxide semiconductor field-effect transistor.

The high-voltage pulse generating circuit may further comprise a circuit component connected to regenerate remaining energy in the inductor in the DC power supply unit after the second semiconductor switch is turned off.

The above circuit component may comprise a diode connected parallel to the first semiconductor switch and having a cathode terminal connected to the anode terminal of the first semiconductor switch. Alternatively, the circuit component may comprise a diode having an anode terminal connected between the DC power supply unit and the second semiconductor switch, and a cathode terminal connected to the other terminal of the inductor.

With the above arrangement, if any energy remains in the inductor, e.g., if a load is connected to the inductor, then excessive energy (unused energy) from the load is returned to the DC power supply unit, contributing to a higher efficiency of operation of the DC power supply unit.

The high-voltage pulse generating circuit may further comprise a path for commutating a current flowing through the first semiconductor switch after the second semiconductor switch is turned off. The path may be connected parallel to the first semiconductor switch.

The path may have a capacitor connected between the anode and cathode terminals of the first semiconductor switch. Alternatively, the path may have a capacitor connected between the gate and anode terminals of the first semiconductor switch. The path with the capacitor reduces the operational burden of the first semiconductor switch. The path with the capacitor is effective to reduce the switching loss caused by the first semiconductor switch and to increase the current cutoff resistance of the first semiconductor switch.

When the first semiconductor switch cuts off a current at a high speed or cuts off a large current, a large surge voltage is applied to the excited inductance of the inductor and the first semiconductor switch. However, the above path is effective to reduce the surge voltage for thereby increasing the reliability of the first semiconductor switch.

The first semiconductor switch which is used may not have a high voltage rise rate (dv/dt) at the time it is turned off. The above path with the capacitor is effective to adjust the voltage rise rate (dv/dt) of the first semiconductor switch to an allowable level with the capacitance of the capacitor.

Since much of the energy remaining in the capacitor thus connected is regenerated in the DC power supply unit, any reduction in the efficiency which is caused by the capacitor is small.

If a load is connected to the inductor, then a capacitor may be connected parallel to the load. The capacitor thus connected makes it easy for the excited inductance of the inductor to commutate a current to the load after the first semiconductor switch cuts off the current. As with the path described above, the capacitor thus connected is also effective to reduce the switching loss caused by the first semiconductor switch and increase the current cutoff resistance of the first semiconductor switch. The capacitor connected parallel to the load can absorb the energy stored in the excited inductance of the inductor, thus suppressing the surge voltage on the excited inductance. Because much of the energy remaining in the capacitor thus connected is also regenerated in the DC power supply unit, any reduction in the efficiency which is caused by the capacitor is small.

According to the present invention, another high-voltage pulse generating circuit comprises a DC power supply unit having opposite terminals, an inductor, a first semiconductor switch, and a second semiconductor switch which are connected in series between the opposite terminals of the DC power supply unit, and a resistor connected between a terminal of the inductor which has another terminal connected to an anode terminal of the first semiconductor switch, and a gate terminal connected to a gate terminal of the first semiconductor switch.

With the above arrangement, when the second semiconductor switch is turned on, the first semiconductor switch is reliably turned on. If the first semiconductor switch comprises is controlled based on current, then it is not turned on unless a current is introduced into the gate thereof. The resistor connected as described above is effective in reliably turning on the first semiconductor switch.

Use of the resistor makes the high-voltage pulse generating circuit relatively low in cost even if the DC power supply unit is constructed to produce a high power supply voltage.

The above and other objects, features, and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIGS. 2A through 2E are waveform diagrams showing the waveforms of voltages and currents in the high-voltage pulse generating circuit according to the first embodiment;

FIG. 3 is a circuit diagram of a high-voltage pulse generating circuit according to a second embodiment of the present invention;

DETAILED DESCRIPTION OF THE INVENTION

Figure 1:
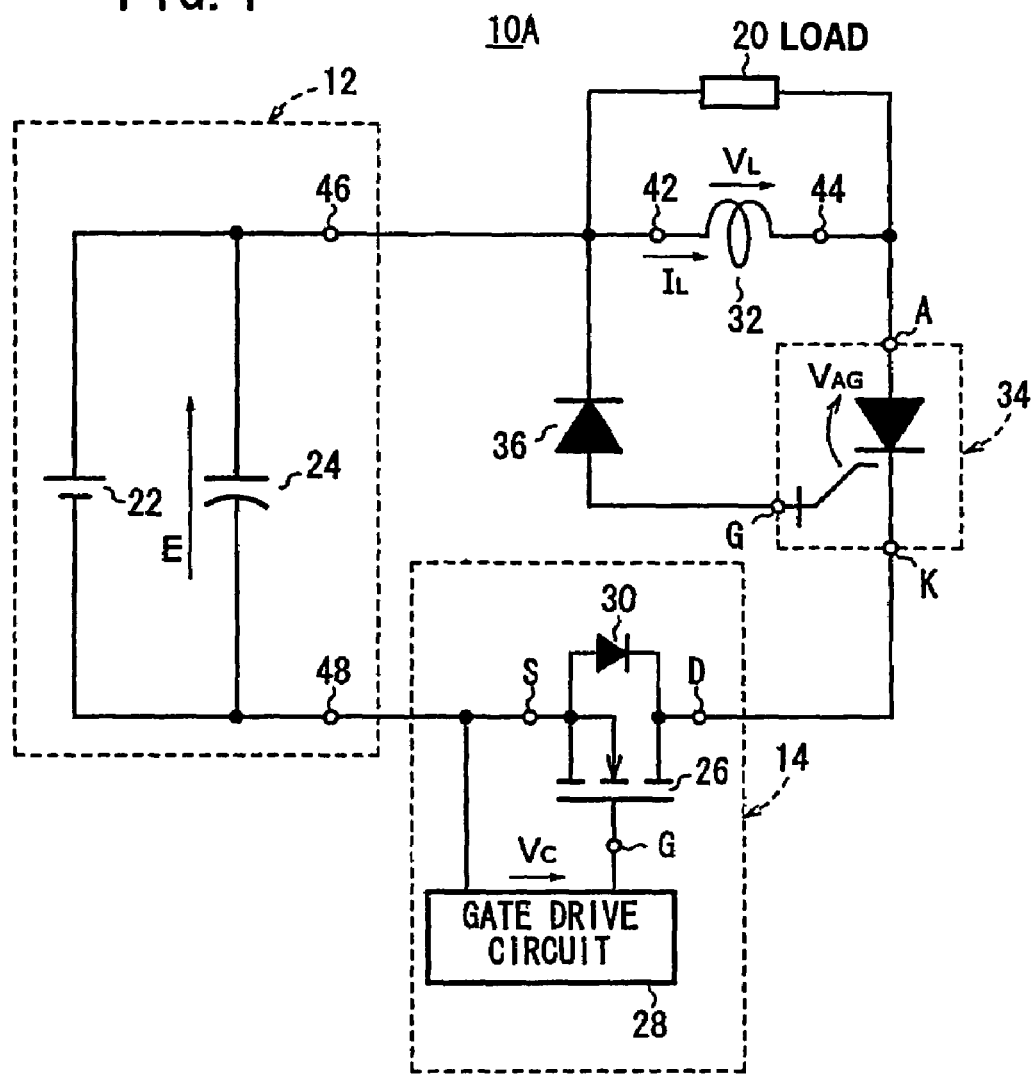
FIG. 1 is a circuit diagram of a high-voltage pulse generating circuit according to a first embodiment of the present invention.

High-voltage pulse generating circuits according to various embodiments of the present invention will be described below with reference to FIGS. 1 through 14. Similar or corresponding parts are denoted by similar or corresponding reference characters throughout views.

As shown in FIG. 1, a high-voltage pulse generating circuit 10A according to a first embodiment of the present invention has an inductor 32, a first semiconductor switch 34, and a second semiconductor switch 14 which are connected in series between positive and negative terminals 46, 48 of a DC power supply unit 12. The DC power supply unit 12 comprises a DC power supply 22 for generating a DC power supply voltage E and a capacitor 24 for lowering a high-frequency impedance. The inductor 32 has a terminal 44 connected to an anode terminal A of the first semiconductor switch 34 and another terminal 42 connected to a control terminal (gate terminal) G of the first semiconductor switch 34 through a diode 36. The diode 36 has an anode connected to the control terminal G of the first semiconductor switch 34. A load 20 to which a high-voltage pulse will be applied is connected parallel to the inductor 32.

In the embodiment shown in FIG. 1, the second semiconductor switch 14 is connected to the negative terminal 48 of the DC power supply unit 12. However, the second semiconductor switch 14 may alternatively be connected to the positive terminal 46 of the DC power supply unit 12. Although the load 20 is connected parallel to the inductor 32 in FIG. 1, the load 20 may be connected parallel to the first semiconductor switch 34.

The second semiconductor switch 14 may comprise a self-extinguishing or commutation-turn-off device. In the first embodiment, the second semiconductor switch 14 comprises a power metal-oxide semiconductor field-effect transistor (power MOSFET) 26 with an avalanche diode 30 in inverse-parallel connection. The second semiconductor switch 14 also has a gate drive circuit 28 connected to a gate terminal G and a source terminal S of the power MOSFET 26 for controlling the turning on and off of the power MOSFET 26.

The first semiconductor switch 34 may comprise a device controlled by current, or a self-extinguishing or commutation-turn-off device. In the first embodiment, the first semiconductor switch 34 comprises an SI thyristor having a very large resistance with respect to a voltage rise rate (dv/dt) at the time it is turned off and also having a high voltage rating.

Operation of the high-voltage pulse generating circuit 10A according to the first embodiment will be described below primarily in a chronological sequence for supplying a high-voltage pulse $V_L$ to the load 20 with reference to the circuit diagram shown in FIG. 1 and waveform diagrams shown in FIGS. 2A through 2E.

At time $t_0$, the gate drive circuit 28 supplies a control signal Vc (see FIG. 2E) between the gate and source of the power MOSFET 26, which is turned on from an off state.

At this time, the first semiconductor switch 34 is turned on by a field effect caused by applying a positive voltage between the gate G and cathode K thereof (see FIG. 2D) because of a very large impedance provided in opposite polarity by the diode 36. The first semiconductor switch 34 is normally turned on only due to the field effect since the anode current of the first semiconductor switch 34 is prevented from rising by the inductor 32. Alternatively, a resistor may be connected parallel to the diode 36 or a resistor may be connected from another power supply to the gate of the first semiconductor switch 34, and a large gate current may be supplied to the gate terminal G of the first semiconductor switch 34 through such a resistor.

When the second semiconductor switch 14 and the first semiconductor switch 34 are thus rendered conductive at time $t_0$, a voltage, which is substantially the same as the DC power supply voltage E, is applied to the inductor 32. If the inductance of the inductor 32 is represented by L, then as shown in FIG. 2A, a current $I_L$ flowing through the inductor 32 increases linearly with time at a gradient represented by E/L.

When the current $I_L$ reaches a level Ip ($=ET_0/L$) at time $t_1$, storing a desired amount of electromagnetic energy ($=LIp^2/2$) in the inductor 32, the gate drive circuit 28 stops supplying the control signal, turning off the power MOSFET 26 (see FIG. 2E).

At this time, if a floating inductance (mainly a wiring inductance), not shown, other than the inductance of the inductor 32, in the path of the current $I_L$ is large, then the power MOSFET 26 is not cut off instantaneously. Specifically, the current continues to flow for a short period of time, and the output capacitance of the power MOSFET 26 is charged up to the avalanche voltage of the diode 30, whereupon the diode 30 is rendered conductive under the avalanche voltage and hence suffers serious damage. To avoid the above drawback, the floating inductance is ideally minimized allowing the power MOSFET 26 to be turned off without causing an avalanche across the diode 30.

When the power MOSFET 26 is turned off, the current from the cathode K of the first semiconductor switch 34 is eliminated, i.e., the first semiconductor switch 34 is opened. Therefore, the current $I_L$ flowing through the inductor 32 is cut off, and the inductor 32 generates a reverse induced voltage $V_L$ due to the remaining electromagnetic energy stored therein. At this time, however, the diode 36 operates to commutate the current $I_L$ flowing through the inductor 32 to the path from the anode terminal A of the first semiconductor switch 34 to the gate terminal G of the first semiconductor switch 34 to the anode of the diode 36 to the cathode of the diode 36.

It is necessary that any floating inductance of a branch circuit including the diode 36 be as small as possible to finish the commutation of the current within a short period of time. Any voltage drop across diode 36 and inductor 32 is small because the first semiconductor switch 34 remains conductive between the anode and gate until the stored electric charges from the current that has already flowed becomes nil (a storage period).

Therefore, the reverse induced voltage $V_L$ across the inductor 32 is suppressed to a sufficiently low value, that there is almost no reduction in the current $I_L$ in the short storage period (i.e., a period $T_1$ in FIG. 2A). The period $T_1$ is determined based on the amount of electric charges drawn from the gate terminal G of the first semiconductor switch 34. To shorten the period $T_1$ and minimize any reduction in the current $I_L$ through the inductor 32, the first embodiment of the present invention sharply passes as large a current as possible (which cannot be larger than the anode current in the first embodiment) to set the apparent turn-off gain to 1 or less.

At time $t_2$, the electric charges are completely drawn from the first semiconductor switch 34, and a depletion layer in the first semiconductor switch 34 spreads from the gate and the cathode toward the anode, starting to turn off the first semiconductor switch 34. Because the depletion layer depends on a potential developed in the first semiconductor switch 34, the depletion layer spreads as the voltage applied to the junction increases and the turn-off process progresses, and finally reaches a position near the anode.

Therefore, the electric capacitance of the depletion layer changes from a saturated state (conductive state) where many active electric charges are present, to a small electric capacitance which is structurally determined. The current continuously flows from the anode to the gate of the first semiconductor switch 34, thus charging the electric capacitance of the depletion layer from the electromagnetic energy stored in the inductor 32. The voltage for charging the electric capacitance, i.e., the anode-to-gate voltage $V_{AG}$ of the first semiconductor switch 34, initially increases relatively gradually due to the large electric capacitance, but then increases quickly as the depletion layer spreads.

When the current $I_L$ becomes nil at time $t_3$, the voltage $V_{AG}$ and the voltage $V_L$ reach maximum levels $V_{AP}$, $V_{LP}$, respectively, as shown in FIGS. 2B and 2C. At this time, the electromagnetic energy stored in the inductor 32 has entirely been shifted into the electric capacitance of the depletion layer in the first semiconductor switch 34.

This phenomenon is a resonant action based on the inductance of the inductor 32 and the electric capacitance of the first semiconductor switch 34. Consequently, the current $I_L$ flowing through the inductor 32 is essentially of a cosine waveform, and the anode-to-gate voltage $V_{AG}$ of the first semiconductor switch 34 is essentially a sine waveform.

By selecting an appropriate inductance value for the inductor 32, the duration of a pulse generated across the inductor 32 and the load 20 connected in parallel to the inductor 32 can be controlled. Specifically, if the electric capacitance of the first semiconductor switch 34 is represented by an equivalent capacitance C, then the pulse duration Tp is expressed by:

$$Tp \cong \pi\sqrt{LC}$$

The electric charges stored in the electric capacitance of the depletion layer in the first semiconductor switch 34, which has been charged to the maximum level $V_{AP}$ at time $t_3$, start to be discharged through a path from the inductor 32 to the diode 36 which has been rendered reversely conductive by the stored electric charges. The electric charges are continuously discharged for a period $T_3$ until the diode 36 recovers itself and becomes nonconductive at time $t_4$. If any energy remains in the inductor 32 and the electric capacitance of the depletion layer in the first semiconductor switch 34 at time $t_4$, then a current due to the remaining energy flows from the DC power supply unit 12 to the diode 30 of the second semiconductor switch 14 to the cathode K of the first semiconductor switch 34 to the anode A of the first semiconductor switch 34.

During a period $T_4$ in which the current flows in the DC power supply unit 12, the high-voltage pulse generating circuit 10A operates in a regenerative mode. In the regenerative mode, the energy which remains in the inductor 32 and the electric capacitance of the depletion layer in the first semiconductor switch 34 is regenerated and contributes to an increase in the operating efficiency of the high-voltage pulse generating circuit 10A. Therefore, it is important to reduce the time required to recover the diode 36, i.e., the period $T_3$, as much as possible.

Figure 5:
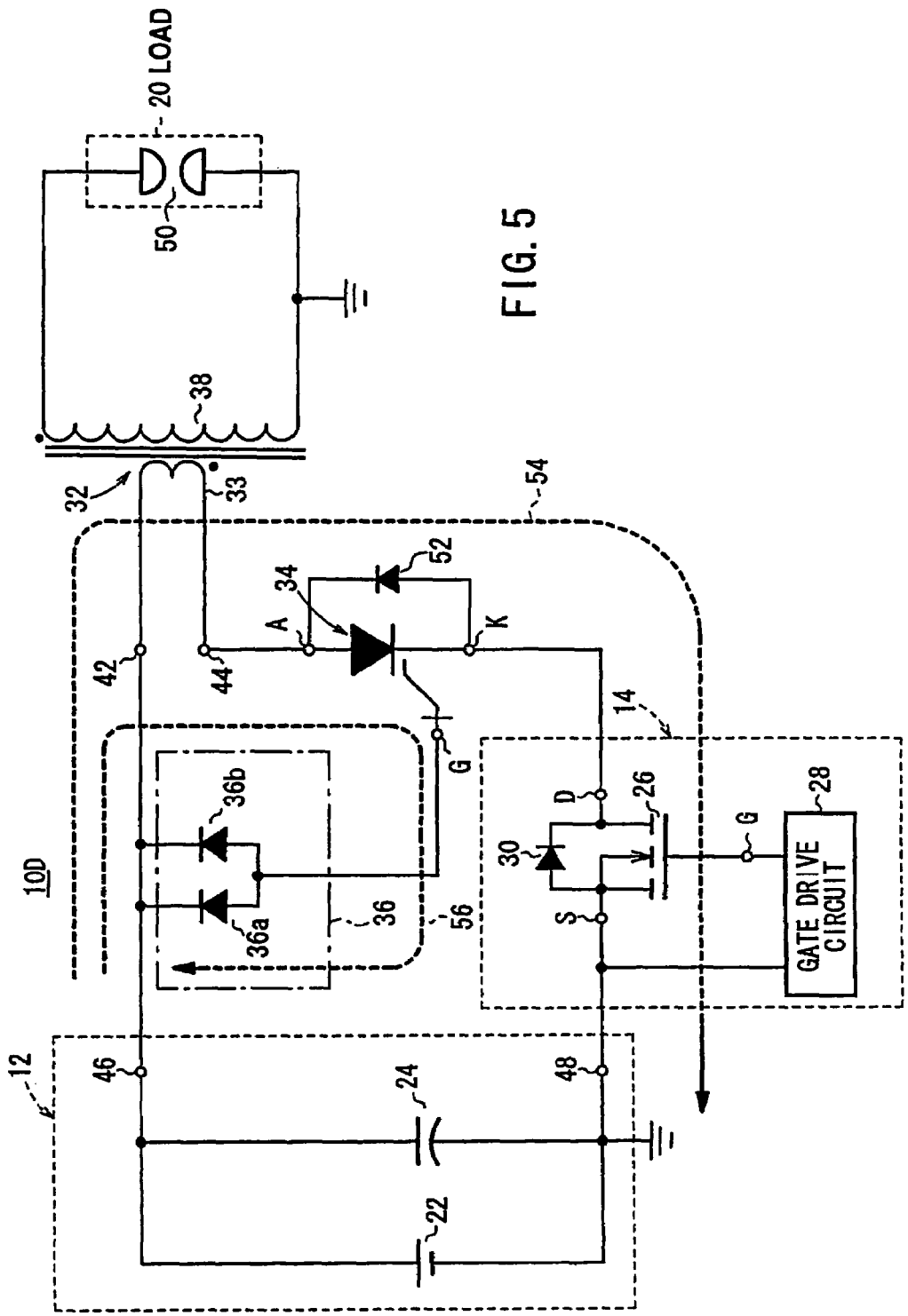
FIG. 5 is a circuit diagram of a high-voltage pulse generating circuit according to a fourth embodiment of the present invention.

In the first embodiment, the load 20 comprises a linear load which may be an equivalent resistive load. If the load 20 comprises a nonlinear load such as a discharging gap 50 as shown in FIG. 5, then the load impedance is quickly reduced while the voltage is increases, and subsequent waveforms are different from those shown in FIGS. 2B and 2C, i.e., subsequent waveforms are pulse-like waveforms whose pulse durations are shorter than those shown in FIGS. 2B and 2C.

In the high-voltage pulse generating circuit 10A according to the first embodiment shown in FIG. 1, the anode-to-gate voltage $V_{AG}$ of the first semiconductor switch 34 is substantially the same as the voltage across the inductor 32. Therefore, a voltage which is equal to or higher than the resistance against the anode-to-gate voltage $V_{AG}$ of the first semiconductor switch 34 cannot be outputted as a pulse from the inductor 32.

Figure 4:
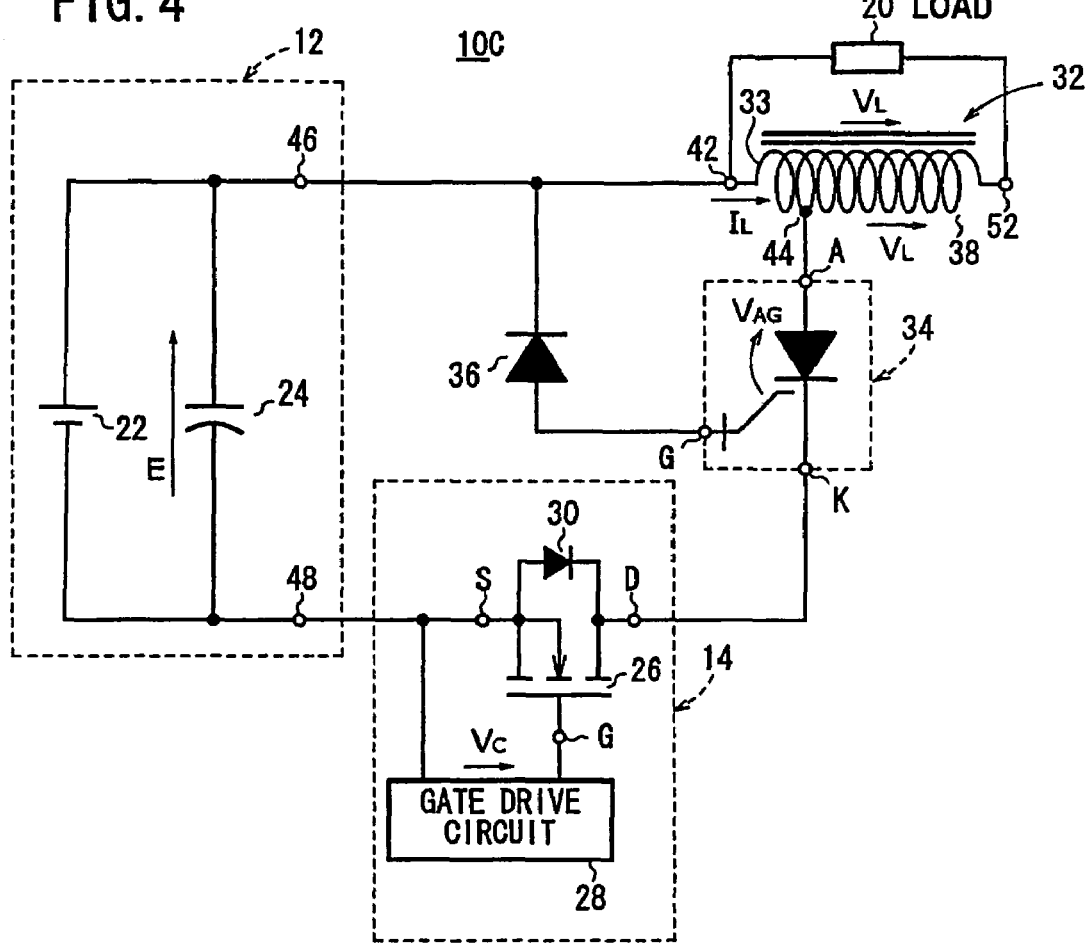
FIG. 4 is a circuit diagram of a high-voltage pulse generating circuit according to a third embodiment of the present invention.

FIGS. 3 and 4 show high-voltage pulse generating circuits 10B, 10C according to second and third embodiments of the present invention. The high-voltage pulse generating circuits 10B, 10C are suitable for outputting a voltage which is equal to or higher than the resistance against the anode-to-gate voltage $V_{AG}$ of the first semiconductor switch 34.

As shown in FIG. 3, the high-voltage pulse generating circuit 10B according to the second embodiment is substantially the same as the high-voltage pulse generating circuit 10A according to the first embodiment, but differs in that the inductor 32 comprises a primary winding 33 and a secondary winding 38, which is magnetically coupled to the primary winding 33 and has a greater number of turns than the primary winding 33.

As shown in FIG. 4, the high-voltage pulse generating circuit 10C according to the third embodiment is substantially the same as the high-voltage pulse generating circuit 10A according to the first embodiment, but differs in that the inductor 32 comprises a primary winding 33 and a secondary winding 38 connected to the primary winding 33 without insulating a DC signal, but connected to the primary winding 33 in additive polarity.

In the second and third embodiments, the primary and secondary windings 33, 38 should preferably be wound around a maginetizable core to provide a close magnetic coupling therebetween and suppress a magnetic flux leakage therefrom.

If the number of turns of the primary winding 33 is represented by N1, the number of turns of the secondary winding 38 by N2 and the ratio between the numbers of turns by n(=N2/N1), then the high-voltage pulse generating circuit 10B according to the second embodiment can output a voltage of $V_{AG} \times N2/N1 = V_{AG} \times n$ to the load 20, and the high-voltage pulse generating circuit 10C according to the third embodiment can output a voltage of $V_{AG} \times (N1+N2)/N1$ to the load 20.

In the second embodiment, the number of turns of the secondary winding 38 is greater than the number of turns of the primary winding 33 such that the secondary winding 38 is of additive polarity. However, the number of turns of the secondary winding 38 may also be smaller than the number of turns of the primary winding 33 such that the secondary winding 38 is of subtractive polarity.

In the third embodiment, the secondary winding 38 is not connected to the primary winding 33 without insulating a DC signal, but connected to the primary winding 33 in additive polarity. However, the secondary winding 38 may also be wound as subtractive-polarity turns connected to the primary winding 33.

To connect the secondary winding 38 in subtractive polarity to the primary winding 33, the secondary winding 38 may be wound around a maginetizable core, for example, in a direction opposite to the direction in which the secondary winding 38 is wound in additive polarity. If the secondary winding 38 is wound in subtractive polarity, then the output terminals of the inductor 32 serve as positive and negative terminals, which are opposite to those of the inductor 32 where the secondary winding 38 is additionally wound in additive polarity to the primary winding 33. The inductor 32 whose secondary winding 38 is wound in subtractive polarity outputs a voltage of $V_{AG} \times (N1-N2)/N1$ to the load 20 whereas the inductor 32 whose secondary winding 38 is wound in additive polarity outputs a voltage of $V_{AG} \times (N1+N2)/N1$ to the load 20. The inductor 32 whose secondary winding 38 is wound in subtractive polarity is effective for use with a semiconductor switch made of a compound semiconductor or the like and having an ultrahigh withstand voltage.

A high-voltage pulse generating circuit 10D according to a fourth embodiment of the present invention will be described below with reference to FIGS. 5 through 7. The high-voltage pulse generating circuit 10D according to the fourth embodiment, shown in FIG. 5 uses a discharging gap 50 as the load 20.

The high-voltage pulse generating circuit 10D according to the fourth embodiment is substantially the same as the high-voltage pulse generating circuit 10B (see FIG. 3) according to the second embodiment, but differs in that it has a diode 52 connected parallel to the first semiconductor switch 34. The diode 52 has anode and cathode terminals connected to the cathode and anode terminals of the first semiconductor switch 34, respectively, and hence is in inverse-parallel connection to the first semiconductor switch 34.

In the embodiment shown in FIG. 5, two parallel-connected diodes 36a, 36b are used as the diode 36, which is connected between the terminal 42 of the inductor 32 and the gate terminal G of the first semiconductor switch 34. The diodes 36a, 36b are functionally identical to the diode 36 in the high-voltage pulse generating circuit 10A according to the first embodiment.

The high-voltage pulse generating circuit 10D according to the fourth embodiment operates as follows: When the power MOSFET 26 is turned on, a current flows through the excited inductance of the inductor 32 as indicated by a path 54 in FIG. 5, storing energy in the inductor 32. The polarities of the inductor 32, which are indicated by the black points, are set as shown in FIG. 5. Since the primary winding 33 has a positive polarity on the side of the black point by a voltage applied thereto, the secondary winding 38 has a positive polarity on the side of the black point, if the secondary winding 38 is open. For example, as shown in FIG. 2C, when the second semiconductor switch 14 and the first semiconductor switch 34 are turned on at time $t_0$, the first winding 33 of the inductor 32 is applied with the substantially same voltage as the direct power supply voltage E, as described above. Therefore, a negative voltage is generated across the secondary winding 38 of the inductor 32, the negative voltage having the substantially same value as the direct power supply voltage E×the ratio n between the numbers of turns (see the dashed waveform in FIG. 2C). When the power MOSFET 26 is turned off, the current that has flowed from the anode terminal A to the cathode terminal K of the first semiconductor switch 34 is commutated from the anode terminal A to the gate terminal G. The electric charges remaining in the first semiconductor switch 34 are drawn from the gate of the first semiconductor switch 34, which is then turned off.

Figure 6:
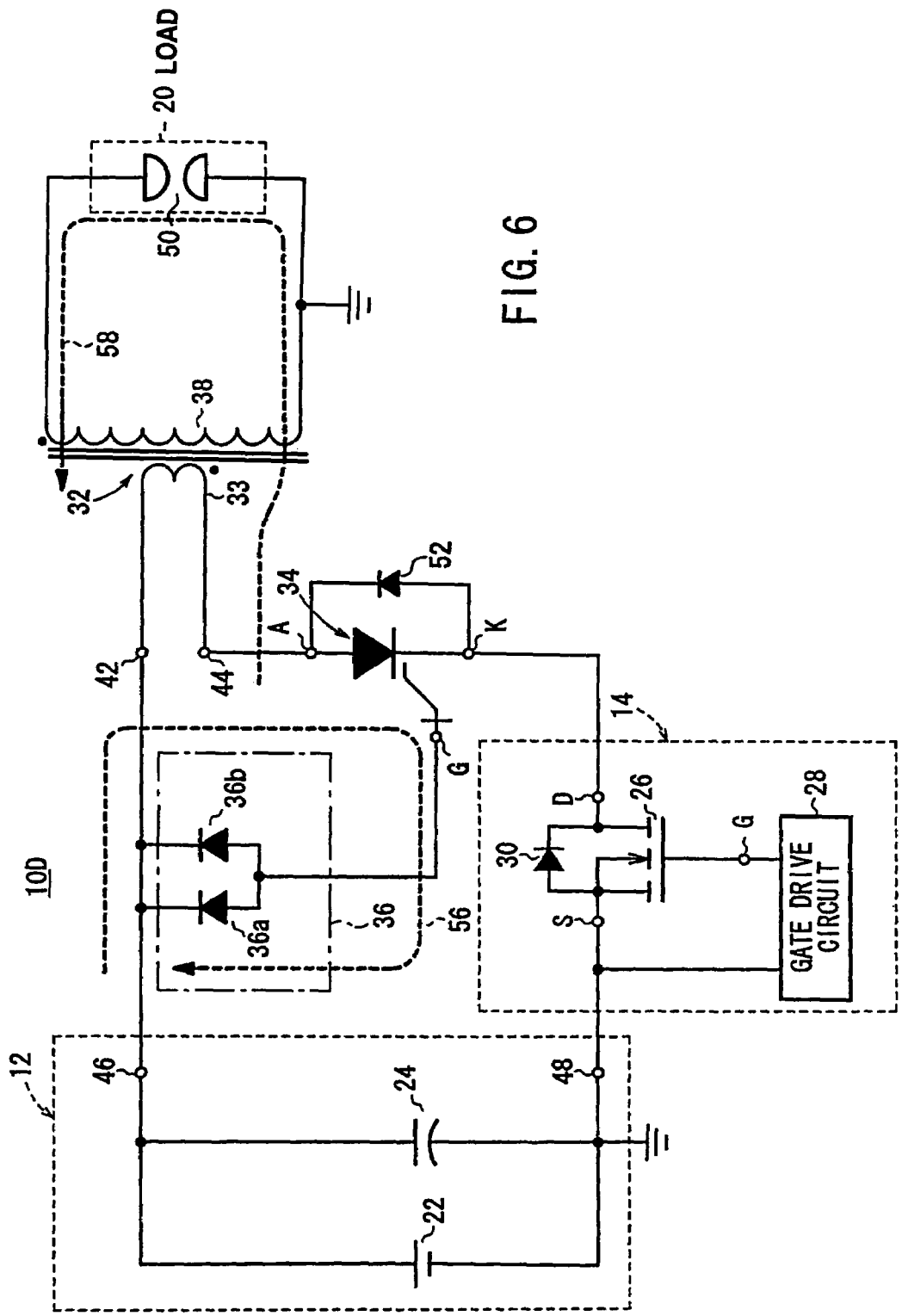
FIG. 6 is a circuit diagram of the high-voltage pulse generating circuit according to the fourth embodiment, the view showing the manner in which a current flowing through the excited inductance of an inductor flows to a load through the inductor.

When the first semiconductor is turned off, as shown in FIG. 6, the current that has flowed through the excited inductance of the inductor 32 is commutated through the inductor 32 to the load 20. At this time, a large pulse voltage is generated across the inductor 32, producing an electric discharge across the gap 50 of the load 20.

Since a parasitic capacitive component exists in general semiconductor switches, including the first semiconductor switch 34, not all the commutated current flows through the load 20, but some of the current flows to charge the parasitic capacitance of the first semiconductor switch 34.

If the load comprises a capacitive load such as the discharging gap 50, then the energy is consumed by an electric discharge. However, not all the energy may be consumed or no electric discharge may occur, and much energy remains stored.

The remaining electric charges are discharged through the excited inductance of the inductor 32, i.e., a current flows through the excited inductance of the inductor 32, so that energy is moved again into the excited inductance of the inductor 32.

Figure 7:
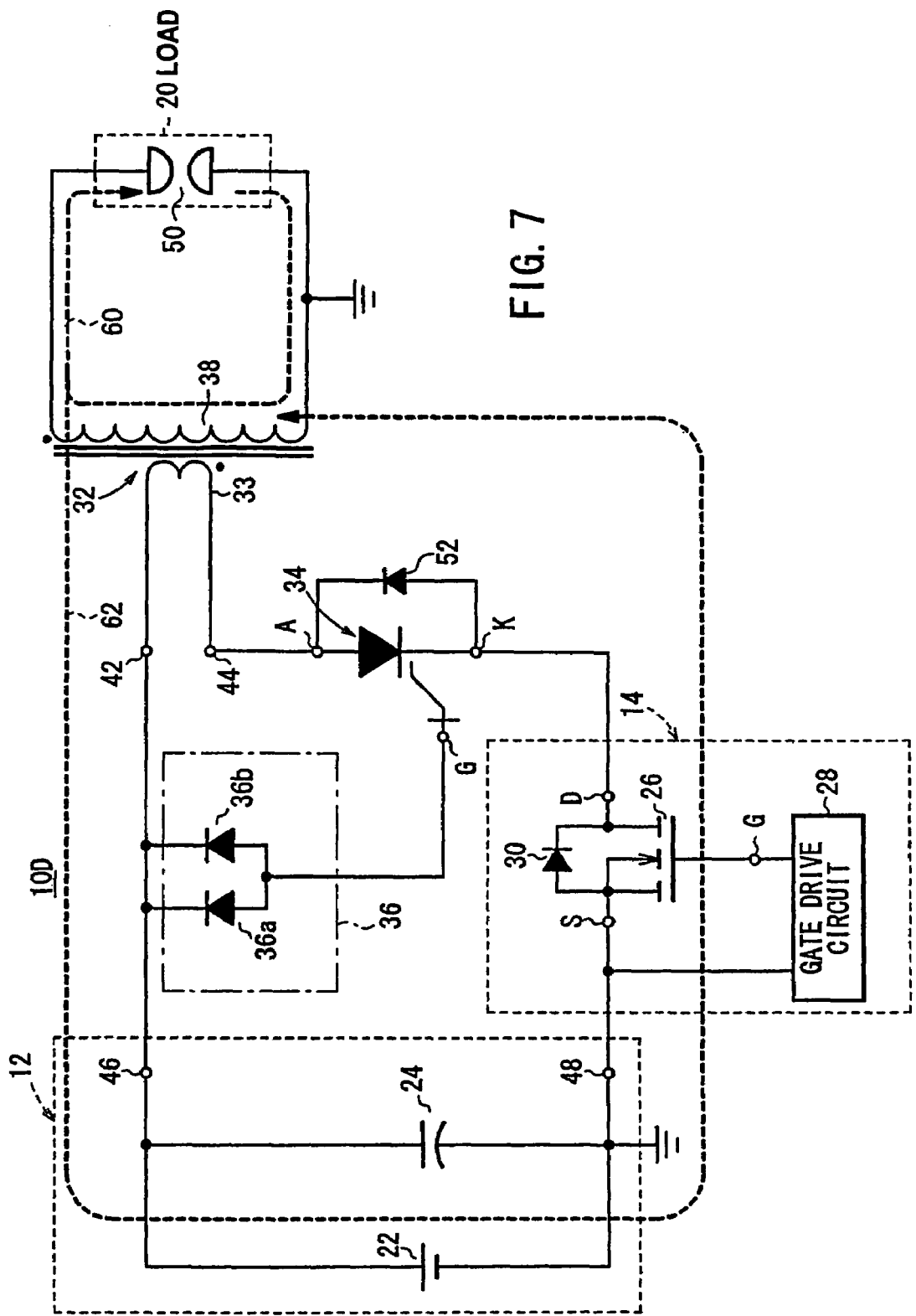
FIG. 7 is a circuit diagram of the high-voltage pulse generating circuit according to the fourth embodiment, the view showing the manner in which energy is regenerated.

When the electric charges stored in the load 20 are gone and the movement of energy into the excited inductance is finished, a current flow through two paths, i.e., first and second paths 60, 62, as shown in FIG. 7.

The first path 60 is a path directed toward the load 20 again, and the second path 62 is a path interconnecting the DC power supply unit 12, the diode 30 arranged in inverse-parallel connection to the power MOSFET 26, and the diode 52 arranged in inverse-parallel connection to the first semiconductor switch 34.

The voltage generated by the inductor 32 is clamped by voltage generated by the DC power supply unit 12 and the two diodes 30, 52, and much of the current flows through the second path 62. The flow of the current through the second path 62 serves to regenerate energy in the capacitor 24 of the DC power supply unit 12 in FIG. 7.

Stated otherwise, excessive energy (unused energy) from the load is returned to the DC power supply unit 12, contributing to a higher efficiency of operation of the DC power supply unit 12.

If the diode 52 were not employed, then the excited inductance of the inductor 32 and the load 20 would resonate, possibly applying a reversed voltage in excess of the withstand voltage to the first semiconductor switch 34. At this time, the second semiconductor switch 14 would be adversely affected, e.g., would be caused to malfunction, by pulsed noise added to the applied voltage. Therefore, it is preferable to connect the diode 52 for the purpose of processing energy in the excited inductance.

Figure 8:
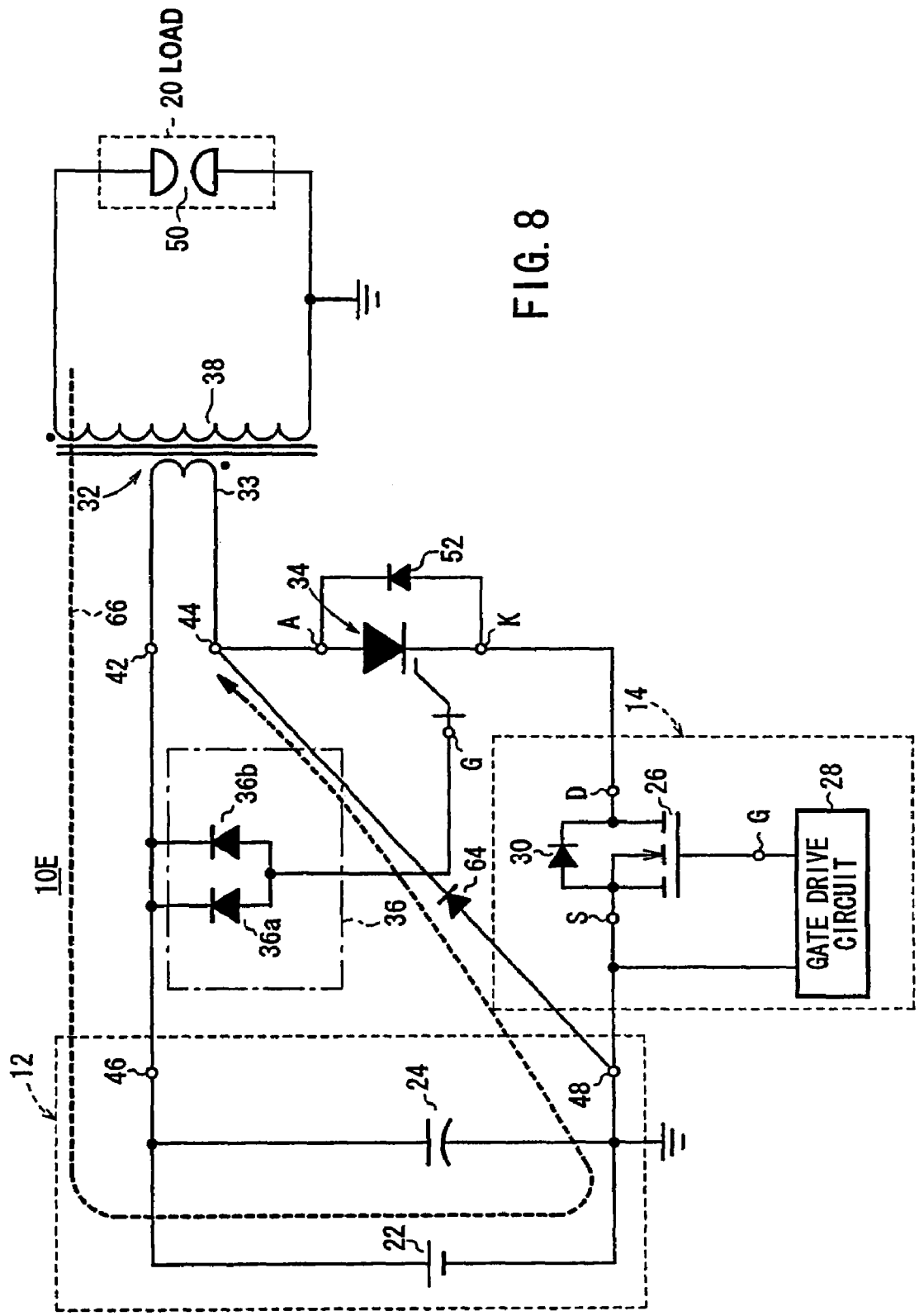
FIG. 8 is a circuit diagram of a high-voltage pulse generating circuit according to a fifth embodiment of the present invention.

In the high-voltage pulse generating circuit 10D according to the fourth embodiment, the diode 52 is connected in inverse-parallel connection to the first semiconductor switch 34. FIG. 8 shows a high-voltage pulse generating circuit 10E according to a fifth embodiment of the present invention, which has a diode 64 having an anode terminal connected to the negative terminal 48 of the DC power supply unit 12 and a cathode terminal connected to a terminal of the inductor 32.

A current flows through a path 66 interconnecting the DC power supply unit 12 and the diode 64, regenerating energy in the DC power supply unit 12. The high-voltage pulse generating circuit 10E according to the fifth embodiment is particularly advantageous in that since only one diode, i.e., the diode 64, is connected to the path of the regenerating current, unlike the above embodiment shown in FIG. 5, any loss caused upon regeneration of energy is small, and the regeneration efficiency is increased because wiring of the path of the regenerating current can be shortened mechanically.

High-voltage pulse generating circuits 10F, 10G according to sixth and seventh embodiments of the present invention will be described below with reference to FIGS. 9 through 12B.

Figure 9:
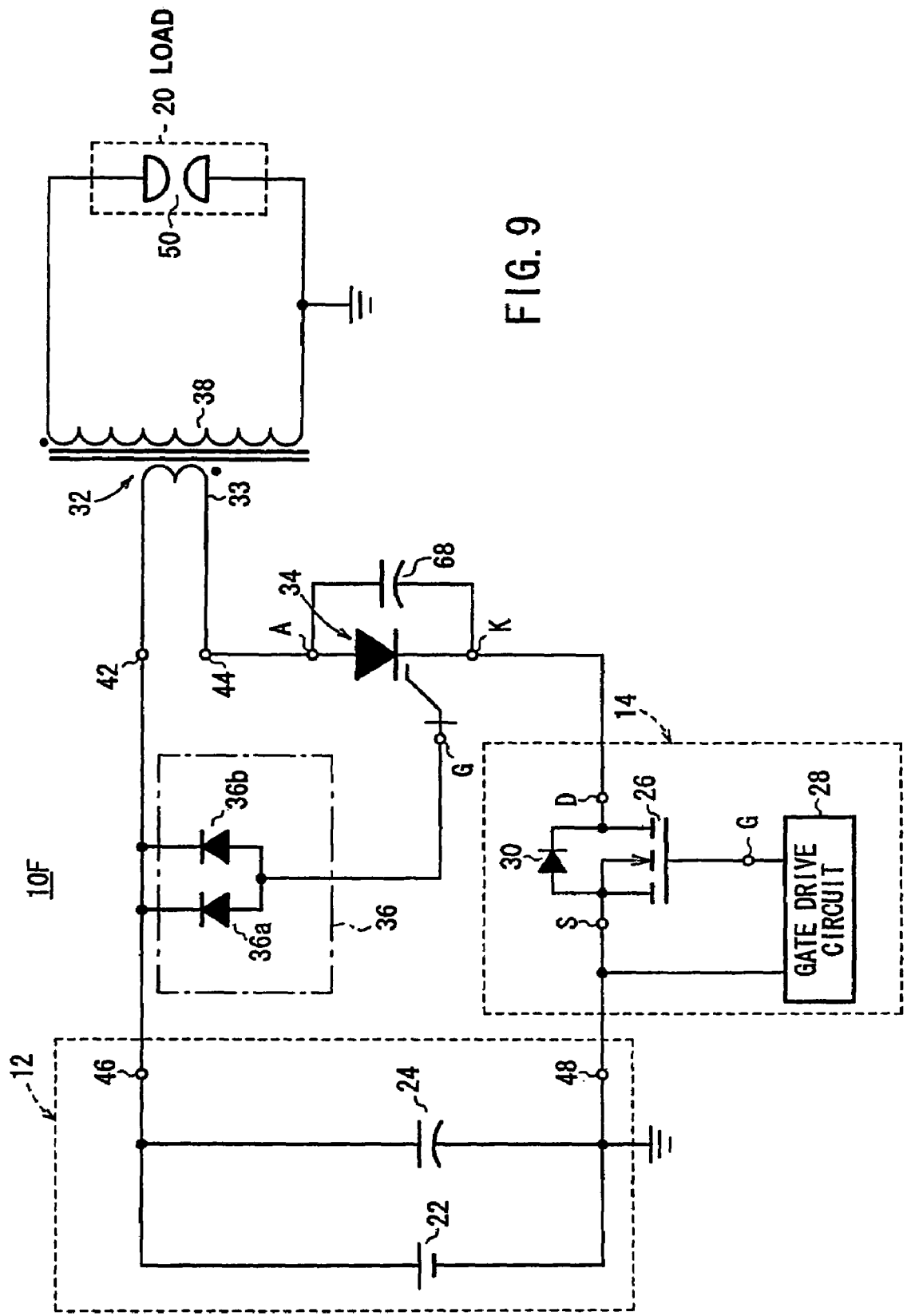
FIG. 9 is a circuit diagram of a high-voltage pulse generating circuit according to a sixth embodiment of the present invention.

The high-voltage pulse generating circuit 10F according to the sixth embodiment is substantially the same as the high-voltage pulse generating circuit 10D (see FIG. 5) according to the fourth embodiment, but differs in that, as shown in FIG. 9, a capacitor 68 is connected parallel to the first semiconductor switch 34 between the anode and cathode terminals of the first semiconductor switch 34.

Figure 10:
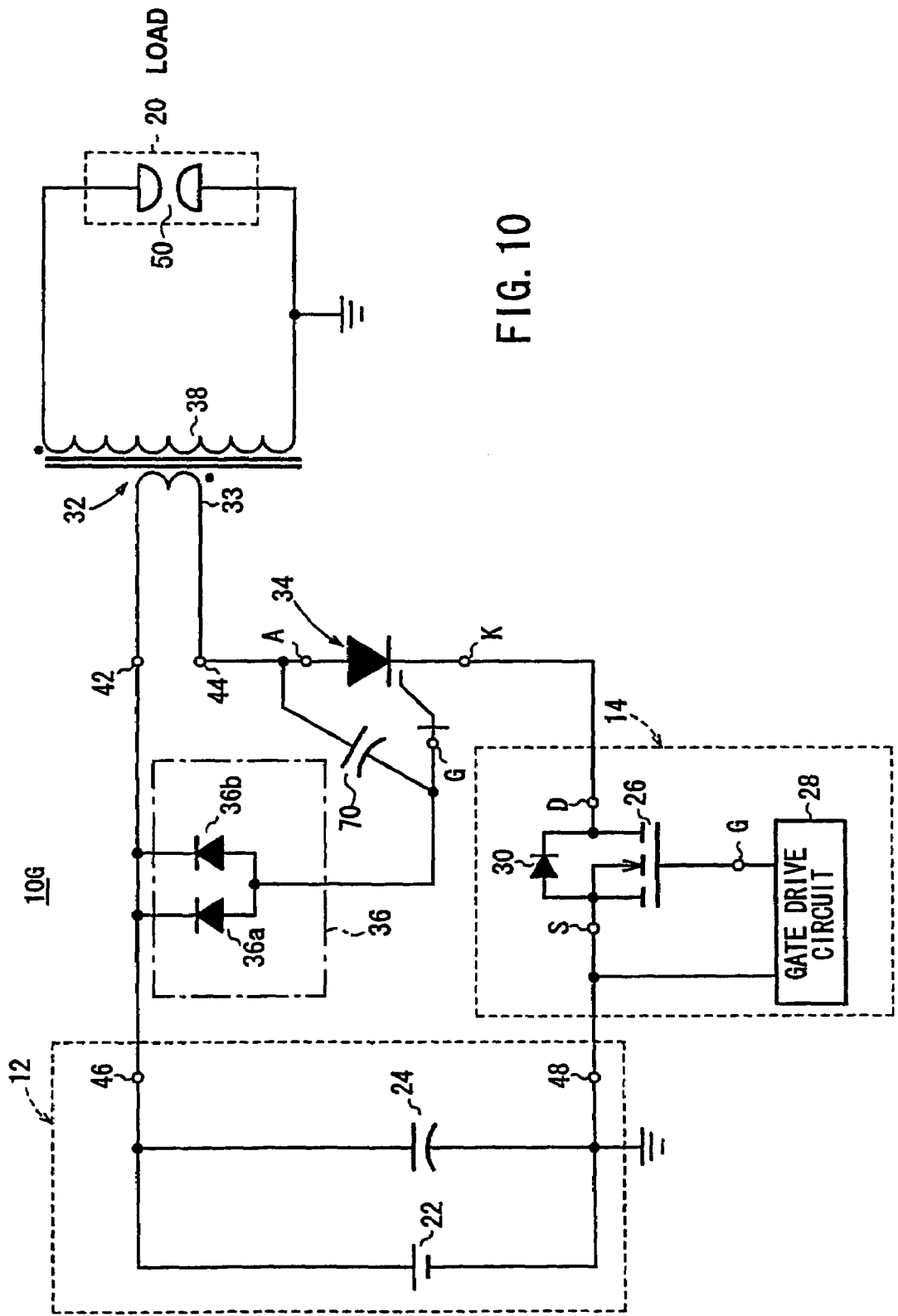
FIG. 10 is a circuit diagram of a high-voltage pulse generating circuit according to a seventh embodiment of the present invention.

The high-voltage pulse generating circuit 10G according to the seventh embodiment is substantially the same as the high-voltage pulse generating circuit 10D (see FIG. 5) according to the fourth embodiment, but differs therefrom in that, as shown in FIG. 10, a capacitor 70 is connected parallel to the first semiconductor switch 34 between the anode and gate terminals of the first semiconductor switch 34.

Figure 11:
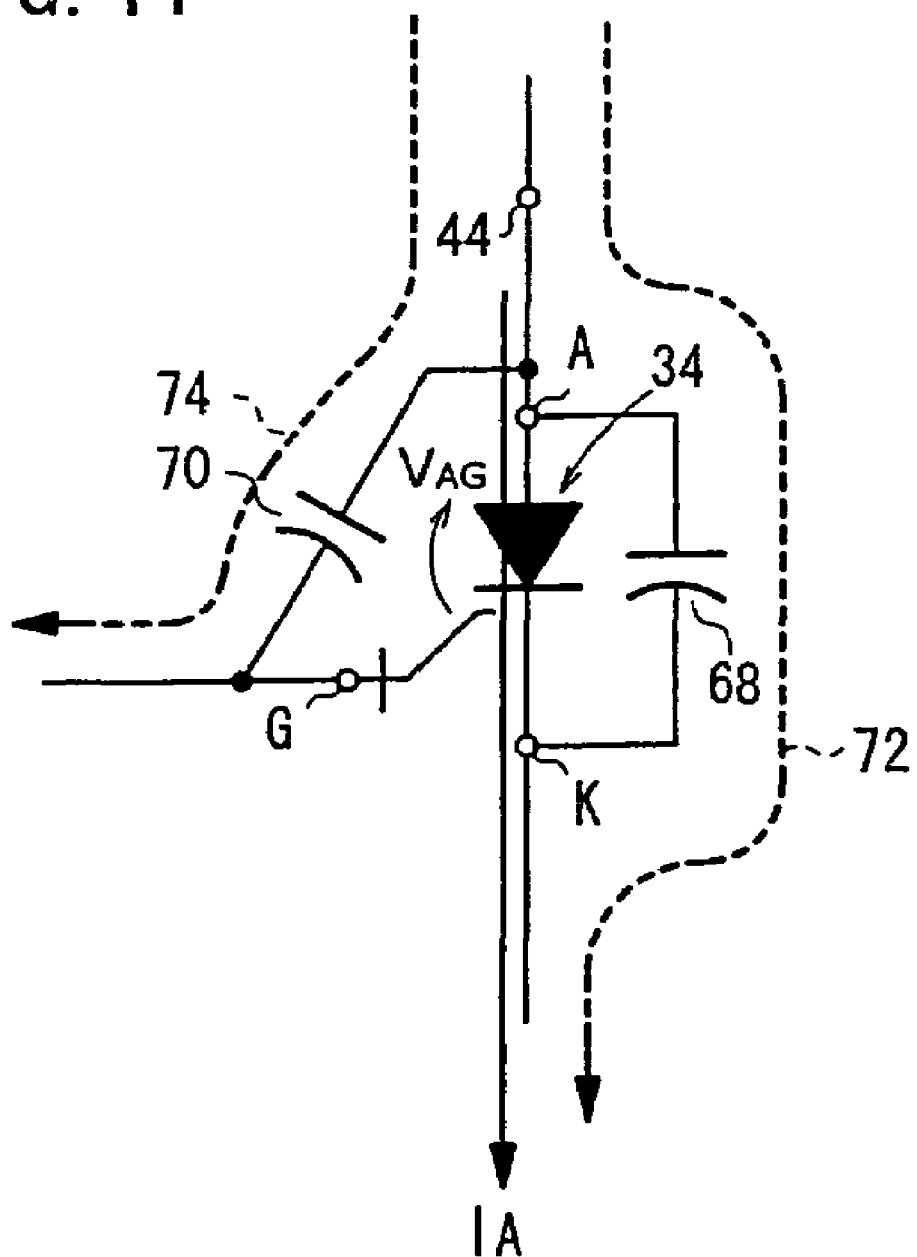
FIG. 11 is a circuit diagram showing the manner in which a current flowing through a first semiconductor switch flows to a capacitor.

The high-voltage pulse generating circuits 10F, 10G according to the sixth and seventh embodiments operate as follows: When the power MOSFET 26 is turned off, the current that has flowed from the anode terminal to the cathode terminal of the first semiconductor switch 34 is commutated from the anode terminal to the gate terminal thereof. The electric charges remaining in the first semiconductor switch 34 are drawn from the gate terminal, whereupon the first semiconductor switch 34 is shifted into a turn-off state. At this time, as shown in FIG. 11, a current $I_A$ which has flowed through the first semiconductor switch 34 is commutated to a path 72 along the capacitor 68 (the sixth embodiment shown in FIG. 9) or a path 74 along the capacitor 70 (the seventh embodiment shown in FIG. 10), reducing the operational burden of the first semiconductor switch 34.

Figure 12A:
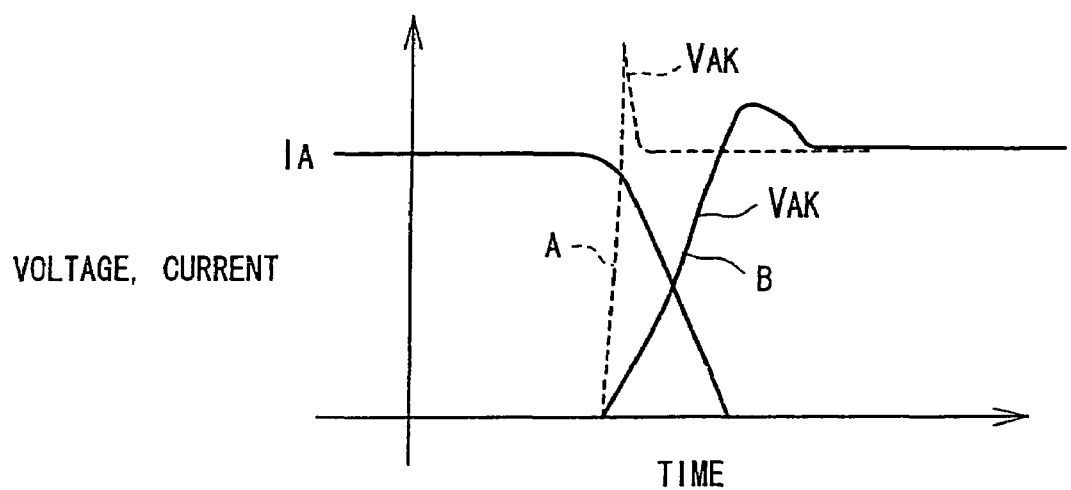
FIG. 12A is a diagram showing how the voltage between the anode and cathode of the first semiconductor switch differs when a capacitor is not connected and when a capacitor is connected.
Figure 12B:
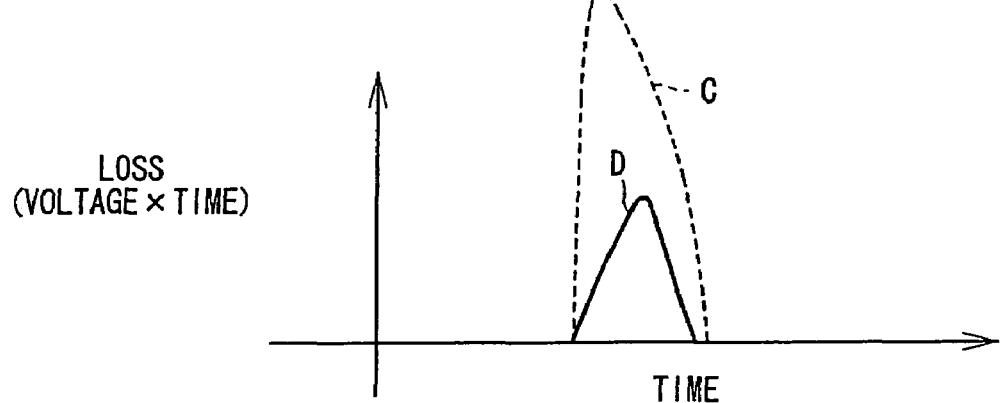
FIG. 12B is a diagram showing how a switching loss differs.

If the capacitor 68 or 70 were not connected, then, as shown in FIG. 12A, the anode current $I_A$, which has flowed through the first semiconductor switch 34, would be reduced as the power MOSFET 26 is turned off. An indicated by the broken-line curve A, an anode-to-cathode voltage $V_{AK}$ of the first semiconductor switch 34 would sharply rise substantially at the same time that the power MOSFET 26 is turned off. The anode-to-cathode voltage $V_{AK}$ would suffer overshooting (pulse distortion), resulting in an increased switching loss (voltage×current) caused by the first semiconductor switch 34 as indicated by the broken-line curve C in FIG. 12B. With the capacitor 68 or 70 being connected, as indicated by the solid-line curve B in FIG. 12A, the anode-to-cathode voltage $V_{AK}$ rises gradually. Therefore, the switching loss caused by the first semiconductor switch 34 is reduced, as indicated by the solid-line curve D in FIG. 12B.

Consequently, the connected capacitor 68 or 70 is effective to reduce the switching loss caused by the first semiconductor switch 34 and to increase the current cutoff resistance of the first semiconductor switch 34.

The increased current cutoff resistance leads to an increase in the capacity of the pulsed power supply. Specifically, since the energy stored in the excited inductance of the inductor 32 is determined by ½×(the excited inductance)×(the cutoff current of the first semiconductor switch 34)², the cutoff current of the first semiconductor switch 34 greatly affects the output capacity of the power supply.

When the first semiconductor switch 34 cuts off a current at a high speed or cuts off a large current, a large surge voltage (pulsed output) is applied to the excited inductance of the inductor 32 and the first semiconductor switch 34. The surge voltage in excess of the voltage rating would adversely affect the first semiconductor switch 34 when applied to the first semiconductor switch 34. However, as described above, the connected capacitor 68 or 70 is effective to reduce the surge voltage for thereby increasing the reliability of the first semiconductor switch 34.

According to the type used, the first semiconductor switch 34 may not have a high voltage rise rate (dv/dt) at the time it is turned off. The capacitor 68 or 70 connected parallel to the first semiconductor switch 34 is effective to adjust the voltage rise rate (dv/dt) of the first semiconductor switch 34 to an allowable level, e.g., 1 kV/μsec, with the capacitance of the capacitor 68 or 70, thereby increasing number of designs for the high-voltage pulse generating circuits 10F, 10G.

Since much of the energy remaining in the capacitor 68 or 70 thus connected is regenerated in the DC power supply unit 12, any reduction in the efficiency which is caused by the capacitor 68 or 70 is small.

Figure 13:
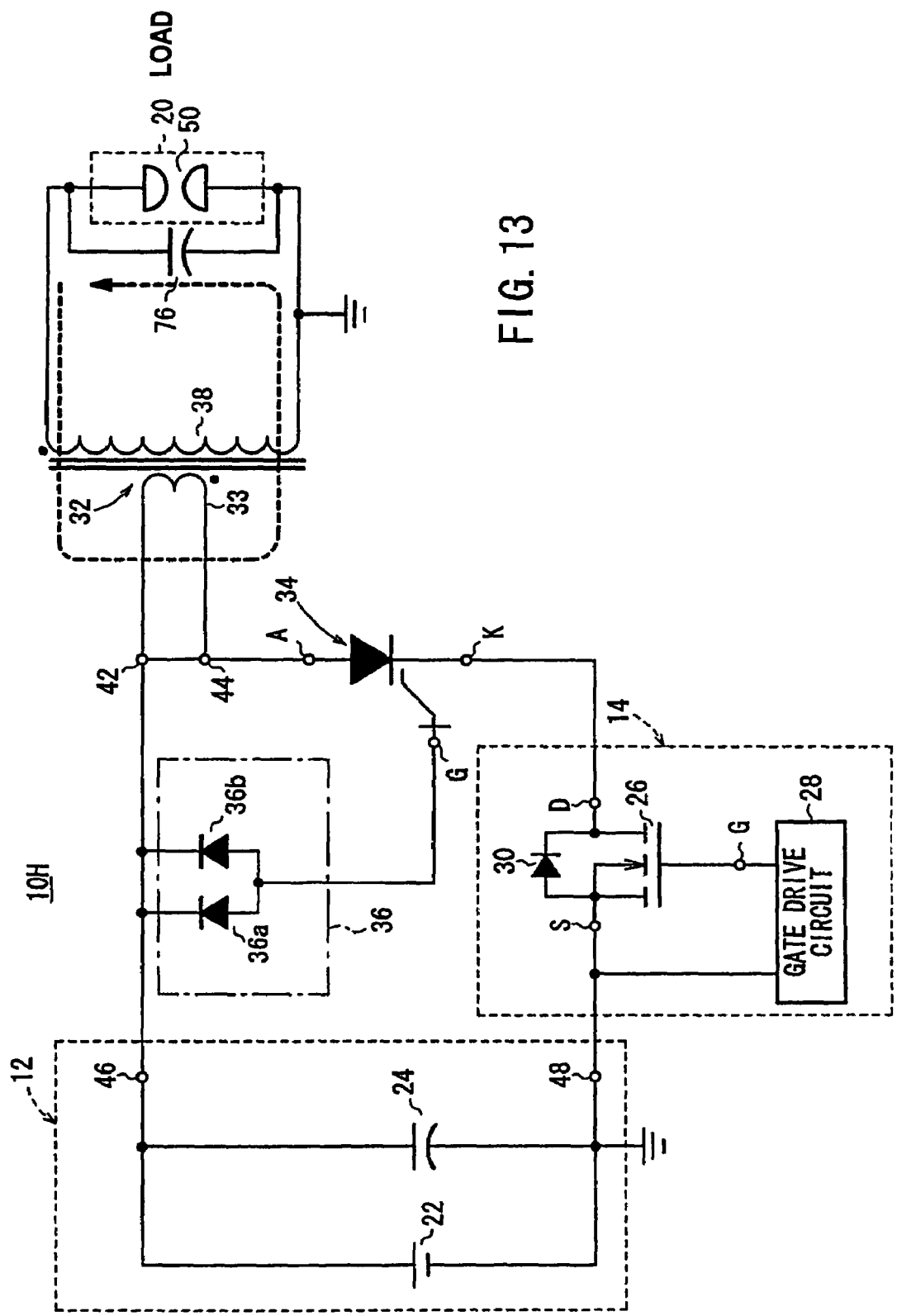
FIG. 13 is a circuit diagram of a high-voltage pulse generating circuit according to an eighth embodiment of the present invention.

A high-voltage pulse generating circuit 10H according to an eighth embodiment of the present invention will be described below with reference to FIG. 13.

The high-voltage pulse generating circuit 10H according to the eighth embodiment is substantially the same as the high-voltage pulse generating circuit 10D (see FIG. 5) according to the fourth embodiment, but differs in that a capacitor 76 is connected parallel to the load 20.

The high-voltage pulse generating circuit 10H according to the eighth embodiment operates as follows: When the first semiconductor switch 34 is turned off, the current that has flowed through the excited inductance of the inductor 32 is commutated through the inductor 32 to the load 20. Since the capacitor 76 is connected parallel to the load 20, the current that has flowed through the excited inductance is easily commutated to the load 20 after the first semiconductor switch 34 cuts off the current. As a result, as with the high-voltage pulse generating circuits 10F, 10G according to sixth and seventh embodiments, the first semiconductor switch 34 is reduced in size, suffers a reduced switching loss, and has an increased current cutoff resistance, and the pulsed power supply has an increased capacity.

When the first semiconductor switch 34 cuts off a current at a high speed or cuts off a large current, a large surge voltage (pulsed output) is applied to the excited inductance of the inductor 32 and the first semiconductor switch 34. However, the capacitor 76 connected parallel to the load 20 can absorb the energy stored in the excited inductance of the inductor 32, thus suppressing the surge voltage on the excited inductance.

Since much of the energy remaining in the capacitor 76 thus connected is regenerated in the DC power supply unit 12, any reduction in the efficiency which is caused by the capacitor 76 is small.

The capacitor 76 connected parallel to the load 20 greatly affects the pulse duration of the pulsed output and the rise of the pulse voltage. Therefore, the capacitor 76 should have settings selected to match the specifications of the high-voltage pulse generating circuit 10H.

Figure 14:
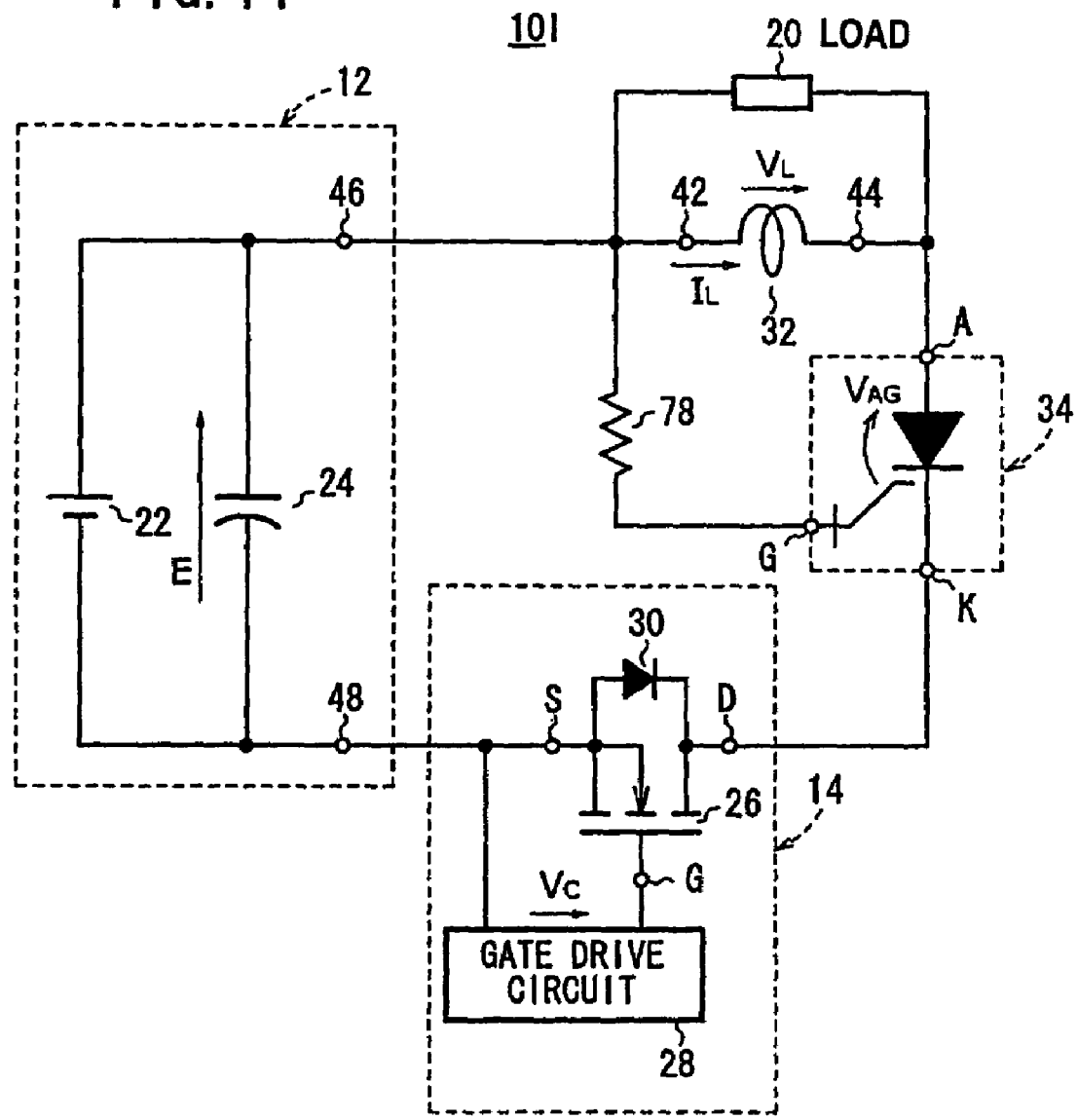
FIG. 14 is a circuit diagram of a high-voltage pulse generating circuit according to a ninth embodiment of the present invention.

A high-voltage pulse generating circuit 10I according to a ninth embodiment of the present invention will be described below with reference to FIG. 14.

The high-voltage pulse generating circuit 10I according to the ninth embodiment is substantially the same as the high-voltage pulse generating circuit 10A (see FIG. 1) according to the first embodiment, but differs in that a resistor 78, rather than the diode 36, is connected between the gate terminal G of the first semiconductor switch 34 and the terminal 42 of the inductor 32.

When the power MOSFET 26 is turned on, the first semiconductor switch 34 can reliably be turned on. If the first semiconductor switch 34 is controlled based on current, then it is not turned on unless a current is introduced into the gate thereof. The resistor 78 connected as described above is effective in reliably turning on the first semiconductor switch 34.

Use of the resistor 78 makes the high-voltage pulse generating circuit 10I relatively low in cost even if the DC power supply unit 12 is constructed to produce a high power supply voltage. Specifically, if the diode 36 is connected between the gate terminal G of the first semiconductor switch 34 and the terminal 42 of the inductor 32 and the DC power supply unit 12 is constructed to produce a high power supply voltage, then the diode 36 needs to comprise a plurality of series-connected diodes for an increased withstand voltage or a diode having a high withstand voltage, which is generally expensive. The resistor 78, however, is inexpensive and makes the high-voltage pulse generating circuit 10I lower in cost.

The high-voltage pulse generating circuits 10A through 10I according to the first through ninth embodiments are advantageous over the conventional high-voltage pulse generating circuit 100 and the proposed high-voltage pulse generating circuit 118 in that only one first semiconductor switch 34 is required as a semiconductor switch to which a high voltage is applied, and a gate drive circuit for energizing the gate of the first semiconductor switch 34, is not required.

The circuit components of the high-voltage pulse generating circuits 10A through 10I according to the first through ninth embodiments where a high voltage is generated or supplied, include only the anode terminal A of the first semiconductor switch 34 and the terminal 44 of the inductor 32. The other circuit components of the high-voltage pulse generating circuits 10A through 10I according to the first through ninth embodiments may be circuit components operated with low-voltage.

Figure 15:
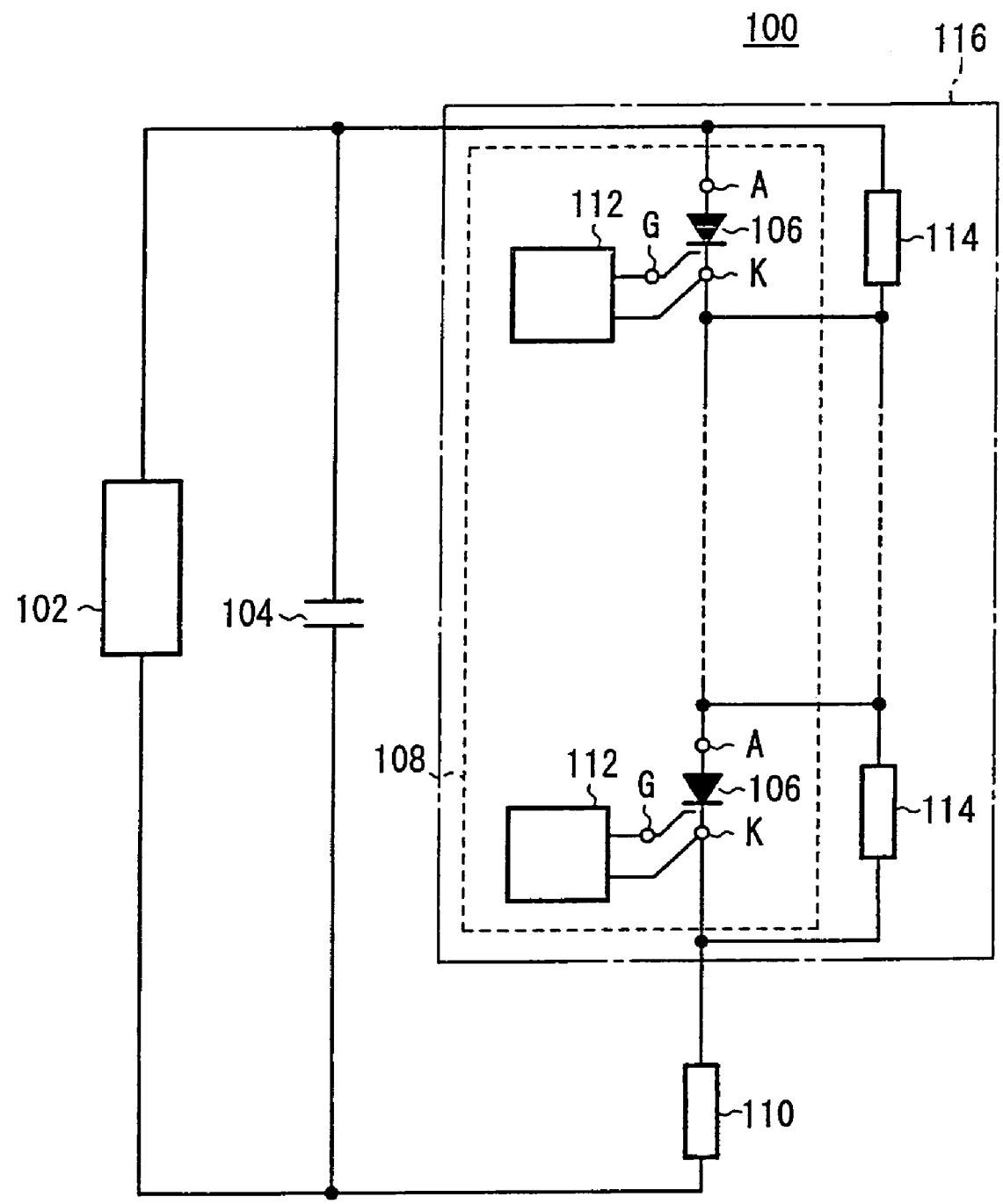
FIG. 15 is a circuit diagram of a conventional high-voltage pulse generating circuit.
Figure 16:
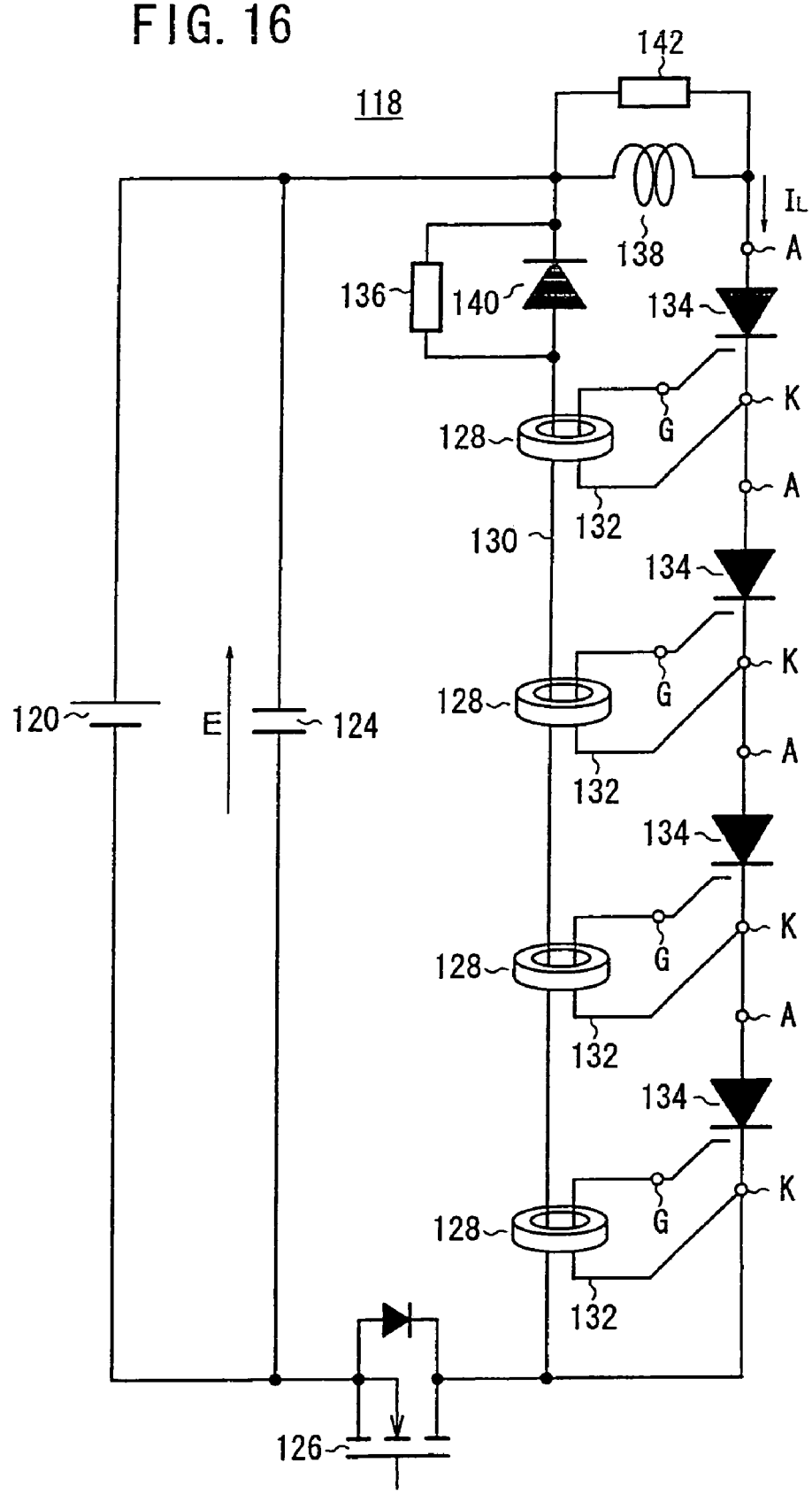
FIG. 16 is a circuit diagram of a proposed high-voltage pulse generating circuit.

For example, if the high-voltage pulse generating circuit according to the present invention is used in an application for decomposing automobile exhaust gases with a plasma generated by a pulse discharge, then the high-voltage pulse generating circuit may be operated by a DC power supply having a power supply voltage of about 42 V, which may be an automobile battery, and the circuit components of the high-voltage pulse generating circuit may have a voltage rating up to several dozen V. The conventional high-voltage pulse generating circuit 100 shown in FIG. 15 needs the capacitor charger 102 as a DC power supply, which is usually very expensive.

The high-voltage pulse generating circuits 10A through 10I according to the first through ninth embodiments can suitably be employed in an apparatus which requires a pulse, having an extremely short rise time and a high voltage rise rate (dv/dt), such as a plasma generating apparatus for decomposing toxic gases.

Although certain preferred embodiments of the pre-sent invention have been shown and described in detail, it should be understood that various changes and modifications may be made therein without departing from the scope of the appended claims.

What is claimed:

1. A high-voltage pulse generating circuit for successively outputting a pulse of positive polarity and a pulse of negative polarity, comprising:
    a transformer and a switch which are connected in series across a DC power supply;
    wherein an output is produced across a secondary winding of said transformer,
    wherein a second semiconductor switch is connected in series between opposite terminals of said DC power supply in addition to said transformer and said switch,
    an anode terminal of said switch is connected to a terminal of a primary winding of said transformer,
    a diode is connected between the other terminal of said primary winding and a gate terminal of said switch,
    an anode terminal of said diode is connected to said gate terminal of said switch, and
    a cathode terminal of said diode is connected to said other terminal of said primary winding.

2. A high-voltage pulse generating circuit according to claim 1, wherein a first pulse as said pulse of positive polarity or said pulse of negative polarity is output across said secondary winding of said transformer when said switch is rendered conductive by a turn-on of said second semiconductor switch, and
    a second pulse having opposite polarity to said first pulse is output when said switch is turned off by a turn-off of said second semiconductor switch.

3. A high-voltage pulse generating circuit according to claim 1, further comprising a capacitor connected in parallel to said switch.

4. A high-voltage pulse generating circuit according to claim 1, wherein a capacitive load is connected across said secondary winding, further comprising a diode connected in parallel to said switch in a reverse orientation.

5. A high-voltage pulse generating circuit according to claim 1, wherein said switch comprises a semiconductor switch.

* * * * *